United States Patent
Shin et al.

(10) Patent No.: US 10,671,319 B2
(45) Date of Patent: Jun. 2, 2020

(54) MEMORY DEVICE CONFIGURED TO STORE AND OUTPUT ADDRESS IN RESPONSE TO INTERNAL COMMAND

(71) Applicant: SAMSUNG ELECTRONICS CO., LTD., Suwon-si, Gyeonggi-do (KR)

(72) Inventors: Seung-jun Shin, Incheon (KR); Hyong-ryol Hwang, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 40 days.

(21) Appl. No.: 16/010,814

(22) Filed: Jun. 18, 2018

(65) Prior Publication Data
US 2019/0138245 A1    May 9, 2019

(30) Foreign Application Priority Data
Nov. 3, 2017    (KR) .................. 10-2017-0146178

(51) Int. Cl.
*G06F 3/06* (2006.01)
*G11C 7/10* (2006.01)
(Continued)

(52) U.S. Cl.
CPC .......... *G06F 3/0659* (2013.01); *G06F 3/0611* (2013.01); *G06F 3/0673* (2013.01); *G06F 12/06* (2013.01); *G11C 7/1018* (2013.01); *G06F 2212/1024* (2013.01); *G06F 2212/1044* (2013.01); *G11C 8/18* (2013.01)

(58) Field of Classification Search
CPC ........ G06F 3/06; G06F 3/0659; G06F 3/0611; G06F 3/0673; G06F 2212/1044; G06F 2212/1024; G06F 12/06; G11C 8/18; G11C 8/10; G11C 7/1018; G11C 7/1048;
(Continued)

(56) References Cited

U.S. PATENT DOCUMENTS 5,469,398 A    11/1995    Scott et al.
6,397,361 B1    5/2002    Saitoh
(Continued)

FOREIGN PATENT DOCUMENTS

JP    2000-183739 A    6/2000
JP    2007-164415 A    6/2007
(Continued)

*Primary Examiner* — Shawn X Gu
*Assistant Examiner* — Jean C Edouard
(74) *Attorney, Agent, or Firm* — Lee IP Law, PC

(57) ABSTRACT

A memory device includes first and second bank groups, an internal command generator, and an address input/output circuit. Each of the bank groups includes a plurality of banks. The internal command generator generates and outputs internal commands to a first target bank. The internal commands are generated based on a command from a memory controller for controlling a memory operation of the first target bank. The address input/output (I/O) circuit receive a first address corresponding to the command, selects a storage path of the first address based on whether there is a bubble interval in a data burst operation interval corresponding to the first command, controls output of the first address in accordance with a time point at which each of the internal commands is output. The first address is stored in the address I/O circuit.

18 Claims, 24 Drawing Sheets

(51) Int. Cl.
*G06F 12/06* (2006.01)
*G11C 8/18* (2006.01)

(58) Field of Classification Search
CPC ... G11C 7/1006; G11C 7/1012; G11C 7/1039; G11C 8/12; G11C 7/10
USPC .......................................................... 711/105
See application file for complete search history.

(56) References Cited

U.S. PATENT DOCUMENTS

| | | | |
|---|---|---|---|
| 6,457,110 B1 * | 9/2002 | Wang | G11C 7/1072 711/105 |
| 7,716,411 B2 | 5/2010 | Panabaker et al. | |
| 7,755,953 B2 * | 7/2010 | Fujiwara | G11C 7/1018 365/189.05 |
| 7,800,416 B2 | 9/2010 | Kim et al. | |
| 7,913,035 B2 * | 3/2011 | Johnson | G06F 5/10 710/52 |
| 7,930,472 B2 * | 4/2011 | Hsu | G06F 5/12 711/109 |
| 9,824,740 B2 * | 11/2017 | Ware | G11C 11/406 |
| 2006/0129740 A1 * | 6/2006 | Ruckerbauer | G06F 13/1631 711/5 |
| 2013/0294174 A1 * | 11/2013 | Oh | G11C 7/1006 365/189.02 |
| 2014/0369153 A1 * | 12/2014 | Kim | G11C 8/18 365/233.1 |
| 2015/0180206 A1 | 6/2015 | Imai | |
| 2015/0213859 A1 * | 7/2015 | Jang | G11C 7/22 365/194 |
| 2016/0378366 A1 * | 12/2016 | Tomishima | G11C 7/1072 711/154 |
| 2017/0270987 A1 * | 9/2017 | Matsuoka | G11C 11/1675 |

FOREIGN PATENT DOCUMENTS

| | | |
|---|---|---|
| JP | 2010-020815 A | 1/2010 |
| KR | 2003-0020124 A | 3/2003 |
| KR | 10-0771544 | 10/2007 |
| KR | 10-0896462 | 4/2009 |
| KR | 10-2010-0030226 | 3/2010 |
| KR | 10-2011-0029220 A | 3/2011 |
| KR | 10-1027673 | 3/2011 |

* cited by examiner

MEMORY DEVICE CONFIGURED TO STORE AND OUTPUT ADDRESS IN RESPONSE TO INTERNAL COMMAND

CROSS-REFERENCE TO RELATED APPLICATION

Korean Patent Application No. 10-2017-0146178, filed on Nov. 3, 2017, and entitled, "Memory Device Configured to Store and Output Address in Response to Internal Command and Method of Operating the Memory Device," is incorporated by reference herein in its entirety.

BACKGROUND

1. Field

One or more embodiments described herein relate to a memory device to control the storage and output of an address in response to an internal command.

2. Description of the Related Art

Semiconductor memory devices are widely used in high-performance electronic systems. One example is a dynamic random-access memory, which is a volatile memory that determines data values based on charges stored in capacitors. In addition, a variety of memory systems have been proposed for writing and reading large amounts of data at high speed. These memory systems may operate based on a reference clock frequency, which is different from a data clock frequency used to transceive data between memory devices and a memory controller. However, there may be drawbacks to using reference and data clock frequencies.

SUMMARY

In accordance with one or more embodiments, a memory device includes a first bank group; a second bank group, each of the first and second bank groups including a plurality of banks; an internal command generator to generate a first internal command and a second internal command based on a first command from a memory controller, the first command to control a memory operation of a first target bank in the first bank group, the internal command generator to output the first internal command and the second internal command to the first target bank; and an address input/output (I/O) circuit to receive a first address corresponding to the first command, select a storage path of the first address based on whether there is a bubble interval in a data burst operation interval corresponding to the first command, control output of the first address in accordance with a time point at which each of the first internal command and the second internal command is output, and store the first address in the address I/O circuit.

In accordance with one or more other embodiments, a memory device includes a first bank group; a second bank group, each of the first and second bank groups including a plurality of banks; an internal command generator to generate a first internal command and a second internal command based on a first command received from a memory controller, the first command to control a memory operation of a first target bank of the first bank group, generate a third internal command based on a second command received from the memory controller to control a memory operation of a second target bank of the second bank group after the first command, and output the first to third internal commands; and an address input/output (I/O) circuit to receive the first to third internal commands, receive from the memory controller a first address corresponding to the first command and a second address corresponding to the second command, and store the first address and the second address using a storage path selected based on whether the third internal command is received, within a first clock cycle from a time point at which the first internal command is received.

In accordance with one or more other embodiments, a memory device includes a first bank group; a second bank group, each of the first and second bank groups including a plurality of banks; an internal command generator to generate a first internal read command and a second internal read command, based on a first read command received from a memory controller and output the first and second internal read commands to a first target bank of the first bank group; and an address input/output (I/O) circuit including a first latch and a second latch, the address I/O circuit to receive from the memory controller a first address corresponding to the first read command and store the first address in the first latch based on the first internal read command. The address I/O circuit is to select the first latch in which the first address is stored based on whether a bubble interval is detected in a data burst operation interval corresponding to the first read command and output the first address stored in the first latch to the first target bank in accordance with a time point at which the internal command generator outputs the second internal read command to the first target bank.

In accordance with one or more other embodiments, a non-transitory computer-readable medium comprising code, which, when executed by a processor, causes the processor to generate, by an internal command generator, a first internal command and a second internal command based on a command from a memory controller, the command to control a memory operation of a first target bank in a first bank group; receive, by an address input/output (I/O) circuit, a first address corresponding to the command; select a storage path of the first address based on whether there is a bubble interval in a data burst operation interval corresponding to the command; control output of the first address in accordance with a time point at which each of the first internal command and the second internal commands is output to the first target bank; and store the first address in the address I/O circuit.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
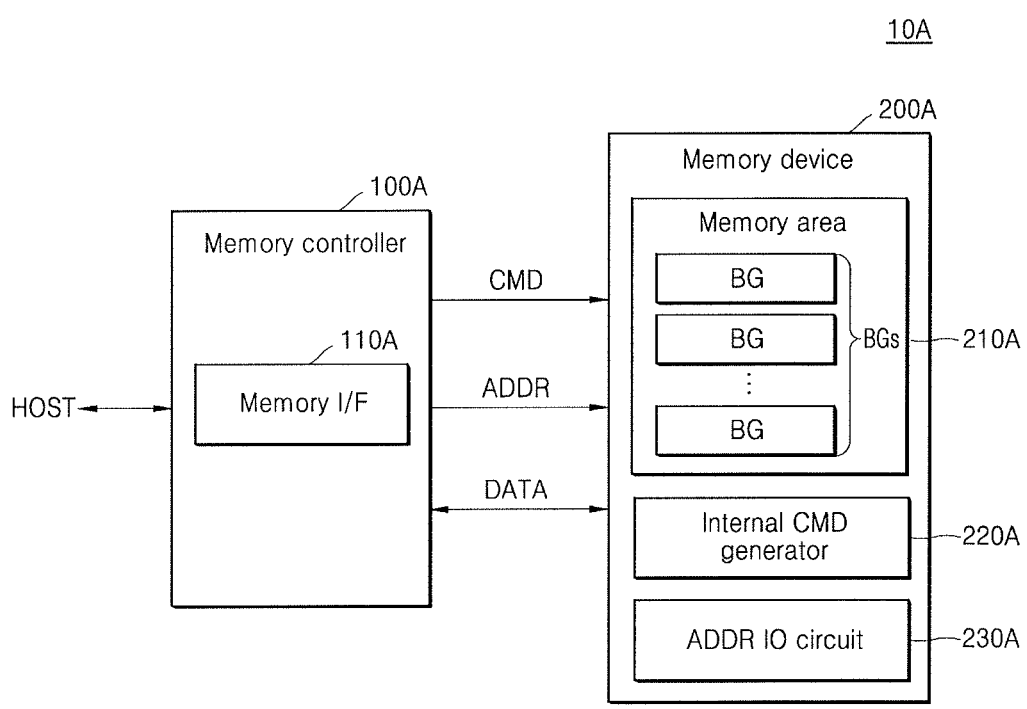
FIG. 1 illustrates an embodiment of a memory system.

FIG. 1 illustrates an embodiment of a memory system 10A which may include a memory controller 100A and a memory device 200A. The memory controller 100A may include a memory interface 110A. The memory controller 100A may provide various signals through the memory interface 110A to the memory device 200A and control memory operations, such as a write operation and a read operation. For example, the memory controller 100A may provide commands CMD and addresses ADDR to the memory device 200A and access data DATA of the memory region 210A. Also, the memory device 200A may transceive data DATA through a DQ pad or a DQ pin between the memory controller 100A and the memory device 200A.

The memory controller 100A may access the memory device 200A upon a request from a host HOST. The memory controller 100A may communicate with the host HOST using various protocols. For example, the memory controller 100A may communicate with the host HOST using an interface protocol, such as peripheral component interface-express (PCI-E), advanced technology attachment (ATA), serial ATA (SATA), parallel ATA (PATA), or serial attached SCSI (SAS). In addition, one of various other interface interfaces, such as a universal serial bus (USB), a multi-media card (MMC), an enhanced small disk interface (ESDI), or an integrated drive electronics (IDE), may be applied to the interface protocol between the host HOST and the memory controller 100A.

The memory device 200A may include a memory region 210A, an internal command generator 220A, and an address I/O circuit 230A. The memory region 210A may include a plurality of bank groups BG. Each of the bank groups BG may include a plurality of banks. In an embodiment, each of the banks may include a memory cell array, a row decoder, a column decoder, and a sense amplifier. The memory device 200A may be dynamic random-access memory (DRAM), such as double-data-rate synchronous DRAM (DDR SDRAM), low-power double-data-rate (LPDDR) SDRAM, graphics double data rate (GDDR) SDRAM, and Rambus DRAM (RDRAM).

The frequency of a reference clock that used as a basis for a memory operation of the memory device 200A may be lower than a frequency of a data clock that is used as a basis for a data burst operation of the memory device 200A. Specifications of the memory system 10A may conform, for example, to standard protocols established by the Joint Electron Device Engineering Council (JEDEC).

Due to a frequency difference between the reference clock and the data clock, an interval (e.g., a bubble interval) in which data DATA is not transceived to and from a DQ pad may occur during a memory operation (e.g., a data burst operation corresponding to a command) of the memory device 200A. To improve efficiency of the memory operation and performance of the memory system 10A, the memory system 10A may perform a memory operation for reducing or minimizing a bubble interval. For example, the memory device 20A may perform the memory operation on each of a plurality of bank groups BG. The address I/O circuit 230A may store an address ADDR to perform the memory operation on each of the bank groups BG, and may perform a first-in-first-out (FIFO) control operation to output the stored address ADDR in an appropriate time point.

The internal command generator 220A may generate internal commands based on a command CMD from the memory controller 100A. In an embodiment, when the burst length of a data burst operation performed by the memory device 200A based on the command CMD is a predetermined number of reference bits or more, the internal command generator 220A may generate at least two internal commands. For example, the internal command generator 220A may generate a first internal command and a second internal command when the burst length of the data burst operation corresponding to the command CMD is 2n bits (n is an integer equal to or more than 2) equal to or more than the reference bits.

The burst length of a data burst operation corresponding to each of the first internal command and the second internal command may be n bits. As described above, by generating the internal commands using the internal command generator 220A, when a data burst operation having a burst length of a predetermined number of reference bits or more is to be performed, the memory device 200A may divide the burst length into burst lengths having a prescribed number of reference bits or less and perform the data burst operation. Furthermore, the internal memory device 220A may operate in an on-the-fly (OTF) mode and perform the data burst operation by varying the burst length.

Assuming that the internal command generator 220A receives the command CMD and generates the first internal command and the second internal command, the address ADDR corresponding to the command CMD may be output to the bank group BG twice in accordance with a time point at which the first internal command is output to the bank group BG and a time point at which the second internal command is output to the bank group BG.

To control output of the address ADDR, the address I/O circuit 230A according to an embodiment may store the address ADDR from the memory controller 100A, and output the address ADDR to the bank group BG in accordance with a time point at which an internal command generated by the internal command generator 220A is output to the bank group BG. The address I/O circuit 230A may select a storage path of the address ADDR based on whether there is a bubble interval in a data burst operation interval corresponding to the received command CMD.

The address I/O circuit 230A may control a circuit that stores an address ADDR when there is the bubble interval in the data burst operation interval corresponding to the received command CMD to be different from a circuit that stores the address ADDR when there is not the bubble interval. The address I/O circuit 230A may output the stored address ADDR to the bank group BG in accordance with a time point at which the internal command is output to the bank group BG. Due to the above-described operations of the address I/O circuit 230A, the bubble interval may be reduced. As a result, the memory device 200A may perform efficient memory operations.

Figure 2:
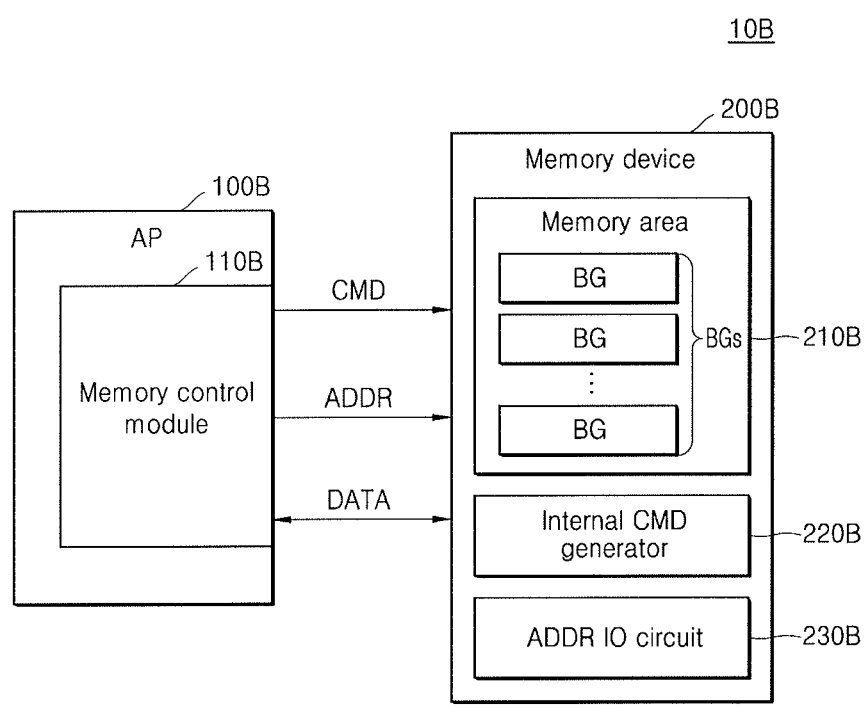
FIG. 2 illustrates another embodiment of a memory system.

FIG. 2 illustrates an embodiment of a memory system 10B which may include an application processor (AP) 100B and a memory device 200B. A memory control module 110B in the AP 100B and the memory device 200B may form a memory system. Also, the memory device 200B may include a memory region 210B, an internal command generator 220B, and an address I/O circuit 230B.

The AP 100B may function as the host HOST of FIG. 1. Also, the AP 100B may be embodied by a System on Chip (SoC), which may include a system bus to which predetermined standard bus protocols are applied and various intellectual properties (IPs) connected to the system bus. An advanced microcontroller bus architecture (AMBA) protocol available from Advanced RISC Machine (ARM) Ltd. may be applied as a standard protocol of the system bus. Examples of bus types to which the AMBA protocol is applied include Advanced High-Performance Bus (AHB), Advanced Peripheral Bus (APB), Advanced eXtensible Interface (AXI), AXI4, and AXI Coherency Extensions (ACE). In addition, other types of protocols, such as uNetwork available from SONICs Inc, CoreConnect available from IBM, and an OCP-IP Open-Core Protocol, may be applied.

The memory control module 110B may serve the same function as the memory controller of the previous embodiment. Also, the memory device 200B may perform a memory operation for reducing or minimizing a bubble interval that may occur due to a difference between a frequency of a reference clock (used for the memory operation) and a frequency of a data clock (used for a data burst operation). The address I/O circuit 230B may store the address ADDR and output the address ADDR in an appropriate time point to support the memory operation.

Figure 3:
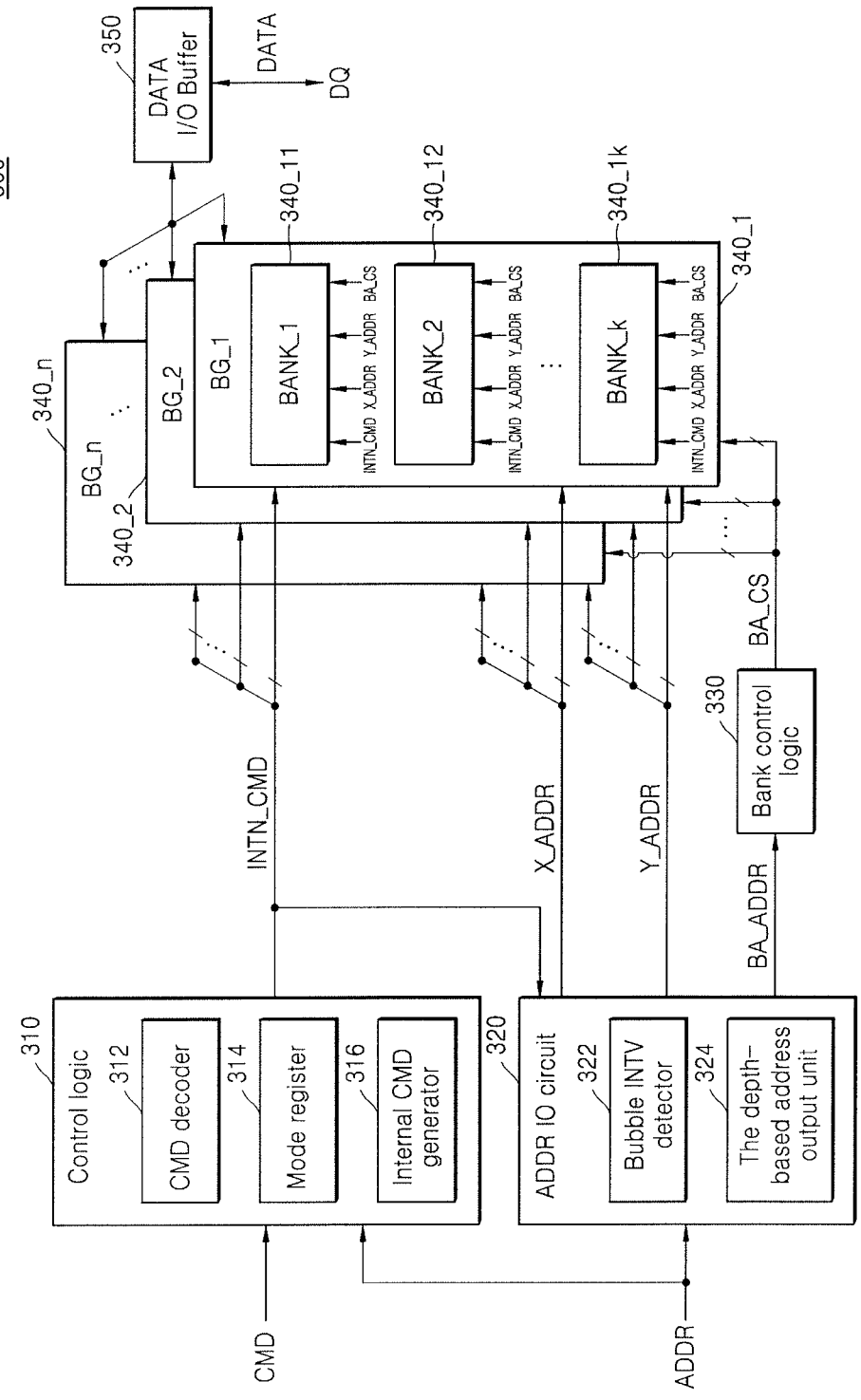
FIG. 3 illustrates an embodiment of a memory device.

FIG. 3 illustrates an embodiment of a memory device 300 which may include control logic 310, an address I/O circuit 320, a bank control logic 330, a plurality of bank groups 340_1 to 340_*n*, and a data I/O buffer 350. The memory device 300 of FIG. 3 is only an example. In one embodiment, the memory device 300 may further include various types of circuits for performing write, read, and/or other memory operations.

The control logic 310 may include a command decoder 312, a mode register 314, and an internal command generator 316. The control logic 310 may control overall operations of the memory device 300. The command decoder 312 may decode an externally applied command CMD and internally generate a decoded command signal. In an example, the command decoder 312 may decode a chip selection signal /CS, a row address strobe signal /RAS, a column address strobe signal /CAS, a write enable signal /WE, and a clock enable signal CKE. Furthermore, the control logic 310 may decode an address ADDR and generate control signals associated with a write command or a read command. The mode register 314 may set an internal register based on a mode register signal for designating an operation mode of the memory device 300 and the address ADDR.

The internal command generator 316 may generate an internal command INTN_CMD based on the decoding result of the command decoder 312. In an embodiment, the internal command generator 316 may generate at least one internal command INTN_CMD based on a burst length of a data burst operation based on the command CMD. The control logic 310 may output the internal command INTN_CMD to the bank groups 340_1 to 340_*n* and the address I/O circuit 320.

The address I/O circuit 320 may include a bubble interval detector 322 and a depth-based address output unit 324. The bubble interval detector 322 may detect a bubble interval in a data burst operation interval corresponding to the command CMD. Within a first clock cycle from a time point at which the memory device 300 receives a command CMD for controlling a memory operation of a target bank of any one bank group (e.g., a first bank group 340_1), the bubble interval detector 322 may detect a bubble interval based on whether the memory device 300 receives another command for controlling a memory operation of a target bank of another bank group (e.g., a second bank group 340_2).

For example, when the command for controlling the memory operation of the target bank of the second bank group 340_2 is received within the first clock cycle from the time point at which the command CMD for controlling the memory operation of the target bank of the first bank group 340_1 is received, the bubble interval detector 322 may generate a detection signal indicating that the bubble interval is not detected. When the command for controlling the memory operation of the target bank of the second bank group 340_2 is received after the first clock cycle, the bubble interval detector 322 may generate a detection signal indicating that the bubble interval is detected.

The bubble interval detector 322 may directly receive the command CMD and detect a bubble interval based on a pattern of the command CMD. In another embodiment, the bubble interval detector 322 may receive the internal command INTN_CMD and detect the bubble interval based on a pattern of the internal command INTN_CMD.

The depth-based address output unit 324 may select and store a storage path of the address ADDR based on the detection signal generated by the bubble interval detector 322. The depth-based address output unit 324 may include a plurality of depth address output circuits for storing various addresses and sequentially outputting the respective addresses stored therein. For example, the depth-based address output unit 324 may include first to third depth address output circuits, which may sequentially output the respective addresses stored therein. The depth-based address output unit 324 may store a first address, which is firstly received, in the first depth address output circuit, store a second address, which is subsequently received, in the second depth address output circuit, and output the first address prior to the second address.

However, as described above, since the memory device 300 generates at least two internal commands INTN_CMD based on the command CMD corresponding to a data burst operation having a burst length of reference bits or more and performs a memory operation based on the at least two internal commands INTN_CMD, the address I/O circuit 320 may output an address ADDR at least twice and control the output of the address ADDR in accordance with time points when the internal commands INTN_CMD are output. Also, as described above, since the memory device 300 may perform a memory operation capable of reducing or minimizing the bubble interval, the depth-based address output unit 324 may control a storage path of the address ADDR based on a command pattern or an internal command pattern to support the memory operation.

The address I/O circuit 320 may output a row address X_ADDR, a column address Y_ADDR, and a bank address BA_ADDR in accordance with a time point at which the internal command INTN_CMD is output to the bank groups 340_1 to 340_n of the control logic 310. In an embodiment, the bank address BA_ADDR may include addresses of the bank groups 340_1 to 340_n and addresses of target banks of the bank groups 340_1 to 340_n. The bank control logic 330 may receive the bank address BA_ADDR and generate a bank control signal BA_CS. Banks in each of the bank groups 340_2 to 340_n may receive an internal command INTN_CMD, a row address X_ADDR, a column address Y_ADDR, and a bank control signal BA_CS in a similar manner to the banks 340_11 to 340_1k in the first bank group 340_1. A target bank in any one of the bank groups 340_1 to 340_n may be enabled based on the bank control signal BA_CS.

A memory operation based on the internal command INTN_CMD may be performed on memory cells in a target bank corresponding to the row address X_ADDR and the column address Y_ADDR.

The data I/O buffer 350 may read data DATA from the target bank and provide the data DATA to the outside (e.g., the memory controller 100A in FIG. 1) of the memory device 300. In one embodiment, the data I/O buffer 350 may receive data DATA from the outside (e.g., the memory controller 100A in FIG. 1) and provide the data DATA to the target bank. The data DATA may be transceived to or from the outside through a DQ pad DQ. Also, the data I/O buffer 350 may perform a data burst operation and transceive the data DATA based on an externally received data clock.

Figure 4:
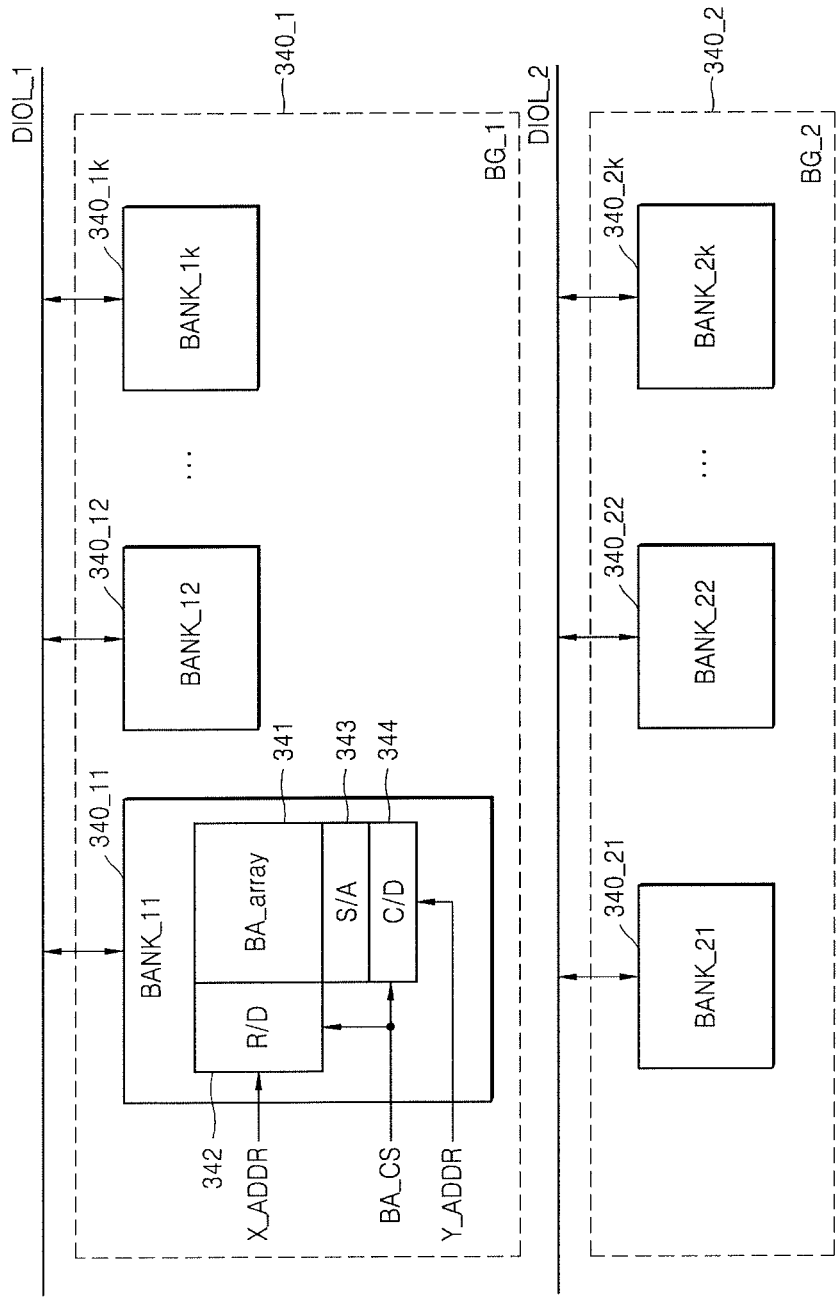
FIG. 4 illustrates an embodiment which includes first and second bank groups.

FIG. 4 illustrates an embodiment of the first bank group 340_1 and the second bank group 340_2 of FIG. 3. Referring to FIG. 4, the first bank group 340_1 may include first to k-th banks 340_11 to 340_1k, and the second bank group 340_2 may include first to k-th banks 340_21 to 340_2k. A first bank 340_11 of the first bank group 340_1 may include a bank array 341 in which a plurality of memory cells are arranged in rows and columns, a row decoder 342, a sense amplifier 343, and a column decoder 344.

Each of the row decoder 342 and the column decoder 344 may receive a bank control signal BA_CS and be enabled. The row decoder 342 and the column decoder 344 may receive a row address X_ADDR and a column address Y_ADDR, respectively, and access at least one memory cell selected for a memory operation based on the row address X_ADDR and the column address Y_ADDR. For example, one bank may be selected from among banks in any one of the bank groups 340_1 to 340_k based on the bank address BA_ADDR of FIG. 3, and memory cells of the selected bank may be addressed based on the row address X_ADDR and the column address Y_ADDR. The configuration of the first bank 340_11 of FIG. 4 may also be applied to other banks 340_12 to 340_2k.

In at least one embodiment, a memory unit including at least one bank may be considered as a bank group. A data I/O line may be shared among banks in one bank group. As shown in FIG. 4, an I/O line to input and output data may be shared among a plurality of banks in one bank group. The banks 340_11 to 340_1k of the first bank group 340_1 may be connected to a first data I/O line DIOL_1, and the banks 340_21 to 340_2k of the second bank group 340_2 may be connected to a second data I/O line DIOL_2. Thus, by connecting a different data I/O line to each bank group, the memory device 300 of FIG. 3 may perform a memory operation on each bank group.

A time interval based on a core cycle for the memory device 300 of FIG. 3 to perform a memory operation based on one internal command may correspond to a first clock cycle in at least one embodiment. For example, a first internal command and a second internal command generated based on a command received to control a memory operation of a target bank of the first bank group 340_1 may be output to the target bank in consideration of the first clock cycle. Also, a time interval of a bubble interval (or a data burst operation interval corresponding to an internal command) may correspond to second clock cycle. However, the first clock cycle and the second clock cycle may be adjusted to various clock time durations in consideration of delays of internal signals of the memory device 300.

Figure 5A:
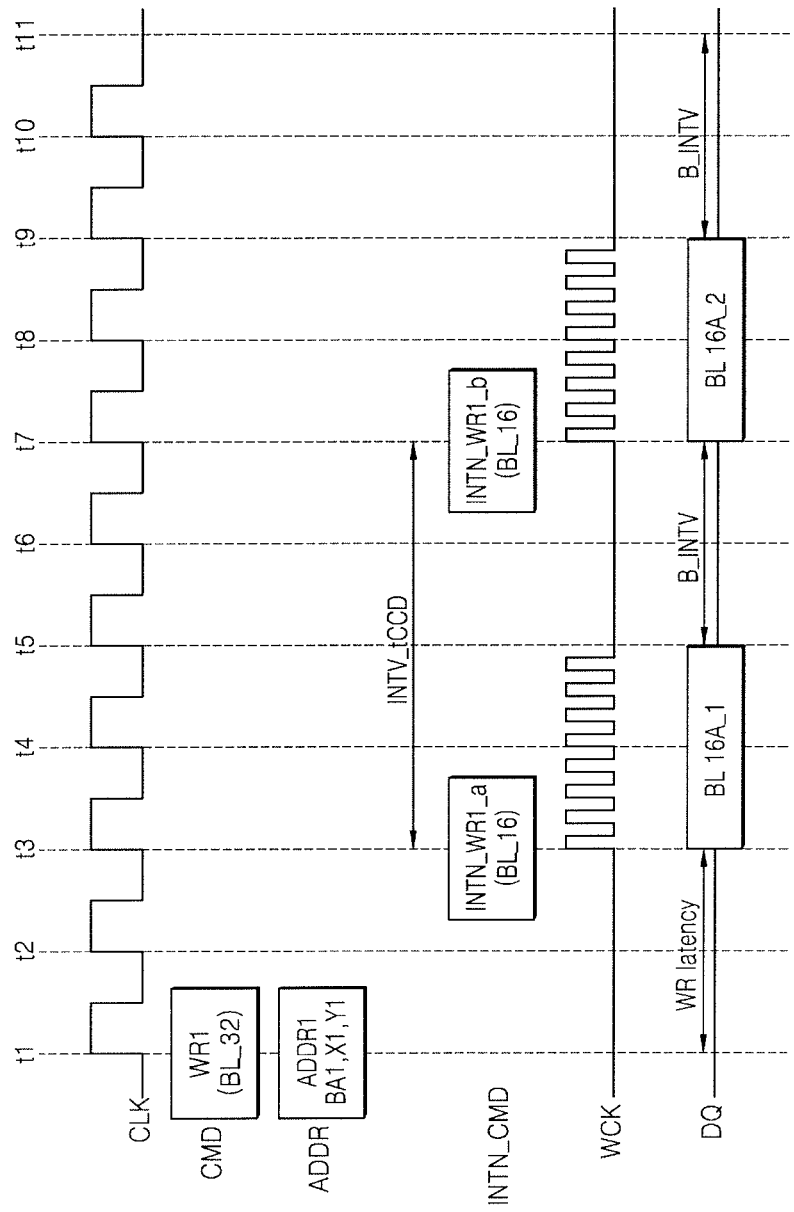
FIG. 5A illustrates an embodiment of signals for controlling a memory device.
Figure 5B:
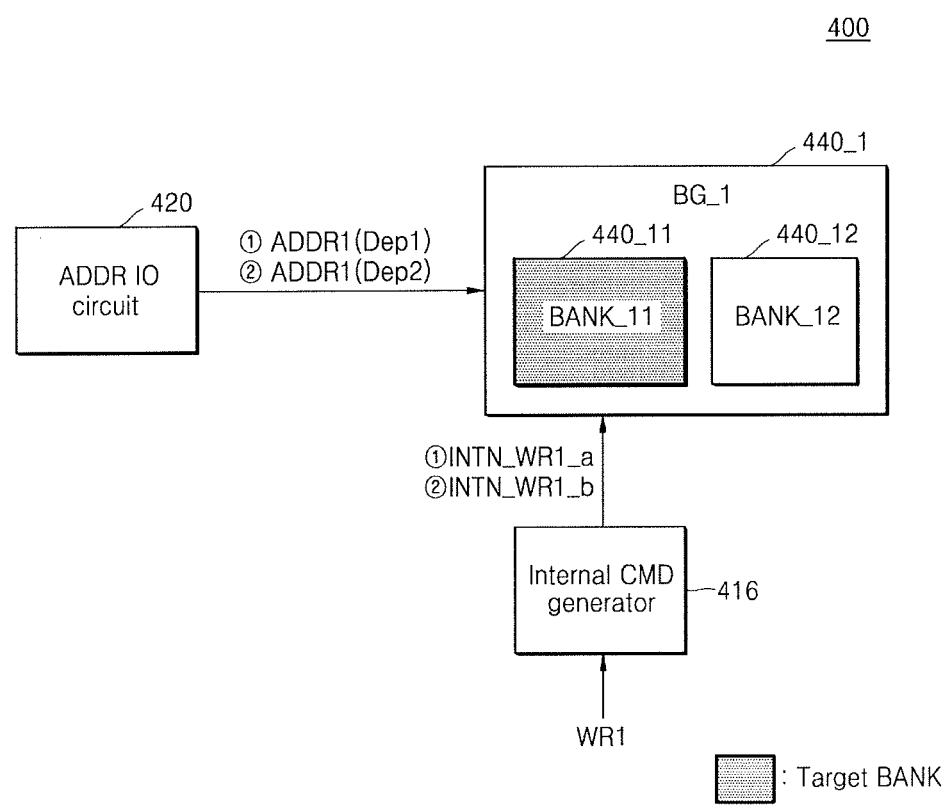
FIG. 5B illustrates an embodiment of the memory device which may be controlled by the signals of FIG. 5A.

FIG. 5A illustrates an embodiment of a timing diagram for operating a memory device 400, which illustrates a bubble interval B_INTV. FIG. 5B is a block diagram of the memory device 400, illustrating an operation of an address I/O circuit 420 when a bubble interval is detected.

In accordance with one embodiment, the frequency of a data clock WCK may be twice the frequency of a reference clock CLK, a first clock cycle may be four clocks, and a second clock cycle may be two clocks. An output time interval (hereinafter, referred to as a time_CAS to CAS delay (tCCD) interval INTV_tCCD) between internal commands generated based on one command may be the first clock cycle. In one embodiment, a write latency 'WR latency' may be two clocks. The frequencies and/or clock cycles may be different in other embodiments.

Referring to FIGS. 5A and 5B, the memory device 400 may receive a first write command WR1 and a first address ADDR1 for controlling a memory operation of a first target bank 440_11 of a first bank group 440_1 in a time point t1. A burst length BL 32 of a data burst operation corresponding to the first write command WR1 may be 32 bits. The first address ADDR1 may include a first bank address BA1 corresponding to the first target bank 440_11 of the first bank group 440_1, a first row address X1, and a first column address Y1. The internal command generator 416 may generate a first internal write command INTN_WR1_a and a second internal write command INTN_WR1_b based on the first write command WR1. A burst length BL 16 of a data burst operation corresponding to each of the first internal write command INTN_WR1_a and the second internal write command INTN_WR1_b may be 16 bits.

The internal command generator 416 may output the first internal write command INTN_WR1_a to the first target bank 440_11 in a time point t3 in consideration of the write latency 'WR latency', and output the second internal write command INTN_WR1_b to the first target bank 440_11 in a time point t7, which is a tCCD interval INTV_tCCD after the time point t7. In this case, the address I/O circuit 420 may output the first address ADDR1 to the first target bank 440_11 in each of the time points t3 and t7 in accordance with the time points when the internal command generator 416 output the first internal write command INTN_WR1_a and the second internal write command INTN_WR1_b to the first target bank 440_11.

The memory device 400 may perform a data burst operation BL 16A_1 corresponding to the first internal write command INTN_WR1_a between the time point t3 and the time point t5. Afterwards, the memory device 400 may perform a data burst operation BL 16A_2 corresponding to the second internal write command INTN_WR1_b between the time point t7 and the time point t9. As a result, during a time interval between t3 and t9 that is a data burst operation interval corresponding to the first write command WR1, the bubble interval B_INTV may occur for a time interval between t5 and t7 and a time interval between t9 and t11 in which a data burst operation is not performed.

In an embodiment, the address I/O circuit 420 may detect the bubble interval B_INTV and store and output the first address ADDR1 based on a detection result. The address I/O circuit 420 may detect the bubble interval B_INTV based on whether another internal write command is received within a first clock cycle (or after a second clock cycle) from a time point at which the first internal write command INTN_WR1_a is received. When the address I/O circuit 420 detects the bubble interval B_INTV, the address I/O circuit 420 may store the first address ADDR1 in a circuit corresponding to a first depth Dep1 to output the first address ADDR1 in the time point t3, which is a write latency 'WR latency' after the time point t1, and store the first address ADDR1 in a circuit corresponding to a second depth Dep2 to output the first address ADDR1 again in the time point t7. The address I/O circuit 420 may firstly output the first address ADDR1 through a circuit corresponding to the first depth Dep1 and then output the first address ADDR1 through a circuit corresponding to the second depth Dep2.

Figure 6A:
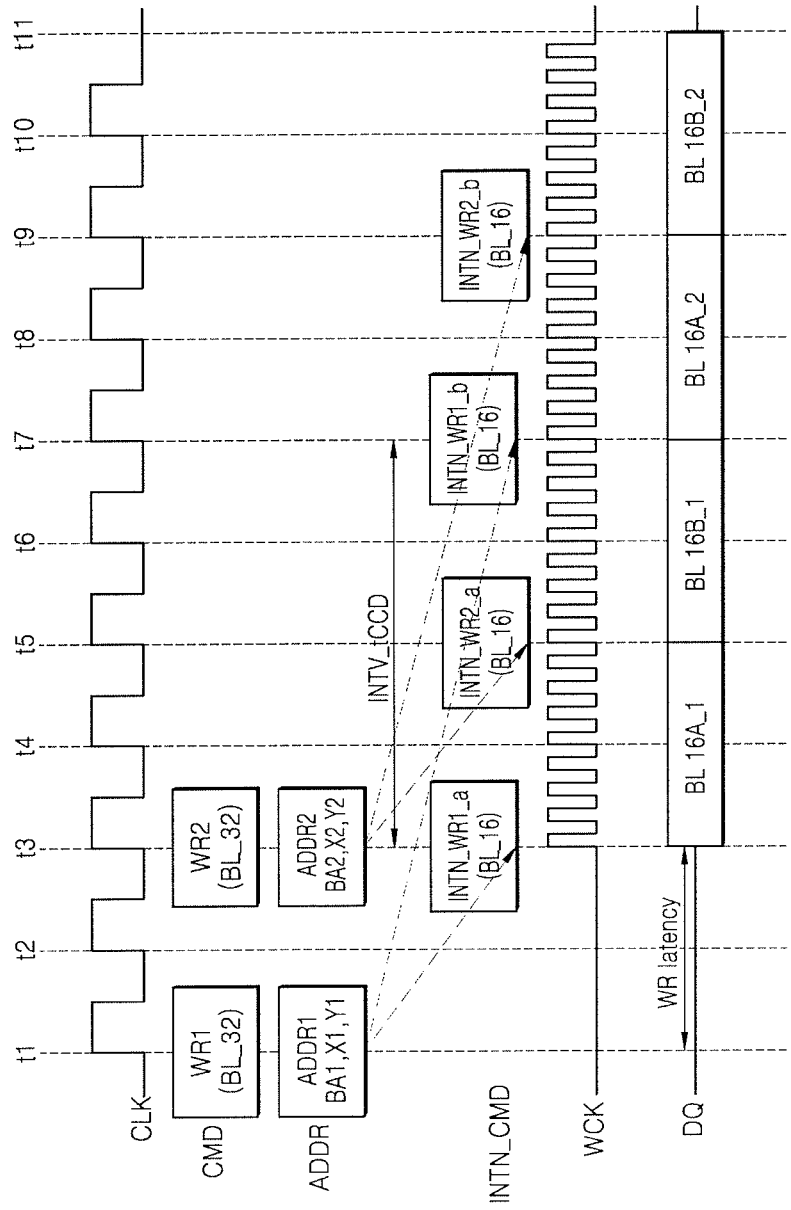
FIG. 6A illustrates an embodiment of a memory operation of a memory device.
Figure 6B:
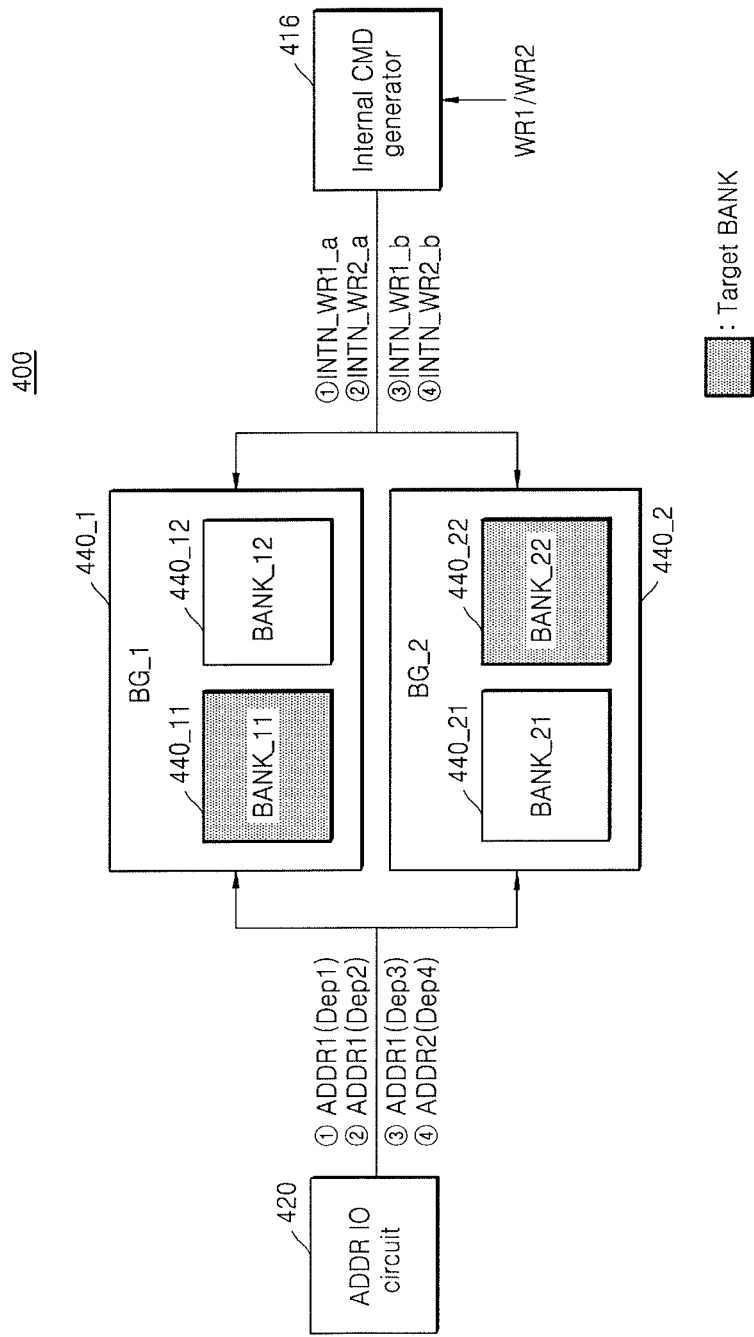
FIG. 6B illustrates an embodiment of a memory device performing the memory operation of FIG. 6A.

FIG. 6A illustrates an embodiment of a timing diagram for a memory operation of a memory device 400. FIG. 6B illustrates an embodiment of the memory device 400, illustrating an operation of an address I/O circuit 420 when a bubble interval is not detected.

Referring to FIGS. 6A and 6B, the memory device 400 may receive a first write command WR1 and a first address ADDR1 for controlling a memory operation of a first target bank 440_11 of a first bank group 440_1 in a time point t1, and receive a second write command WR2 and a second address ADDR2 for controlling a memory operation of a second target bank 440_22 of a second bank group 440_2 in a time point t3. For example, when the memory device 400 may receive the second write command WR2 within a first clock cycle from a time point at which the first write command WR1 is received. The first write command WR1 and the first address ADDR1 may be as described above with reference to FIG. 5A.

A burst length BL 32 of a data burst operation corresponding to the second write command WR2 may be 32 bits. In accordance with one embodiment, the burst length BL 32 of the data burst operation corresponding to the second write command WR2 may be 16 bits or another number of bits.

The internal command generator 416 may output a third internal write command INTN_WR2_a to the second target bank 440_22 in a time point t5 in consideration of a write latency 'WR latency', and output a fourth internal write command INTN_WR2_b to the second target bank 440_22 in a time point t9, which is a tCCD interval INTV_tCCD after the time point t5. In this case, the address I/O circuit 420 may output the second address ADDR2 to the second target bank 440_22 in each of the time points t5 and t9 in accordance with the time points when the internal command generator 416 outputs the third internal write command INTN_WR2_a and the fourth internal write command INTN_WR2_b to the second target bank 420_22.

The memory device 400 may perform a data burst operation BL_16B_1 corresponding to the third internal write command INTN_WR2_a between the time point t5 and the time point t7. Thereafter, the memory device 400 may perform a data burst operation corresponding to the fourth internal write command INTN_WR2_b between the time point t9 and the time point t11. As a result, the bubble interval B_INTV detected in FIG. 5A may be filled with data burst operations BL 16B_1 and BL 16B_2 corresponding respectively to the third internal write command INTN_WR2_a and the fourth internal write command INTN_WR2_b.

In an embodiment, for example, when the address I/O circuit 420 receives the third internal write command INTN_WR2_a within a first clock cycle from a time point at which the address I/O circuit 420 receives the first internal write command INTN_WR1_a, the bubble interval B_INTN may not be detected. When the bubble interval B_INTV is not detected as described above, the address I/O circuit 420 may store the first address ADDR1 in a circuit corresponding to a first depth Dept to output the first address ADDR1 in the time point t3, which is after the write latency 'WR latency' from the time point t1, and store the second address ADDR2 in a circuit corresponding to a second depth Dep2 to output the second address ADDR2 in the time point t5, which is after the write latency 'WR latency' from the time point t3.

Also, the address I/O circuit 420 may store the first address ADDR1 in a circuit corresponding to a third depth Dep3 to output the first address ADDR1 again in the time point t7, and store the second address ADDR2 in a circuit corresponding to a fourth depth Dep4 to output the second address ADDR2 again in the time point t9. The address I/O circuit 420 may output the first address ADDR1 through the circuit corresponding to the first depth Dep1, output the second address ADDR2 through the circuit corresponding to the second depth Dep2, output the first address ADDR1 through the circuit corresponding to the third depth Dep3, and output the second address ADDR2 through the circuit corresponding to the fourth depth Dep4.

FIGS. 5A to 6B illustrate only the operations of the memory device 400 based on the first and second write commands WR1 and WR2. In one embodiment, memory device 400 may operate based on a read command.

Figure 7:
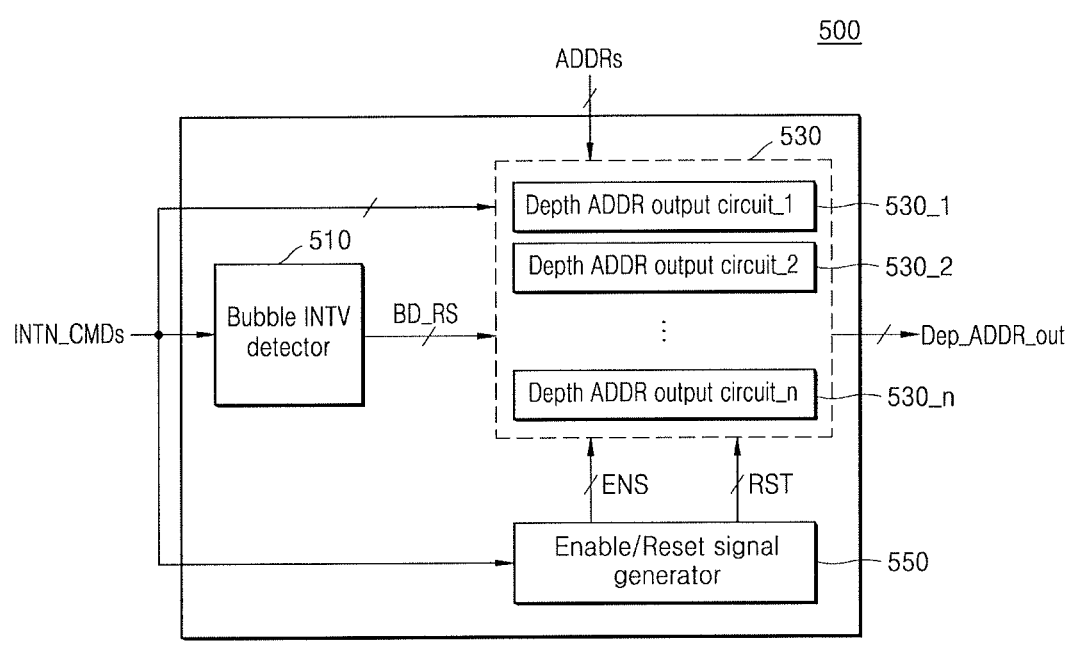
FIG. 7 illustrates an embodiment of an address input/output (I/O) circuit.

FIG. 7 illustrates an embodiment of an address I/O circuit 500 which may include a bubble interval detector 510, a depth-based address output unit 530, and an enable/reset signal generator 550. The bubble interval detector 510 may receive internal commands INTN_CMDs and detect bubble intervals based on patterns of the internal commands INTN_CMDs. The bubble interval detector 510 may generate a detection signal BD_RS based on a detection result of the bubble intervals and provide the detection signal BD_RS to the depth-based address output unit 530.

The depth-based address output unit 530 may include first to n-th depth address output circuits 530_1 to 530_n. Each of the depth address output circuits 530_1 to 530_n may store any one of addresses ADDRs. Also, the respective depth address output circuits 530_1 to 530_n may correspond to different depths and output addresses, which are sequentially stored based on the depths, as depth address output signals Dep_ADDR_out. For example, the first to n-th depth address output circuits 530_1 to 530_n may correspond to first to n-th depths, respectively, and thus, output sequentially stored addresses.

Figure 8:
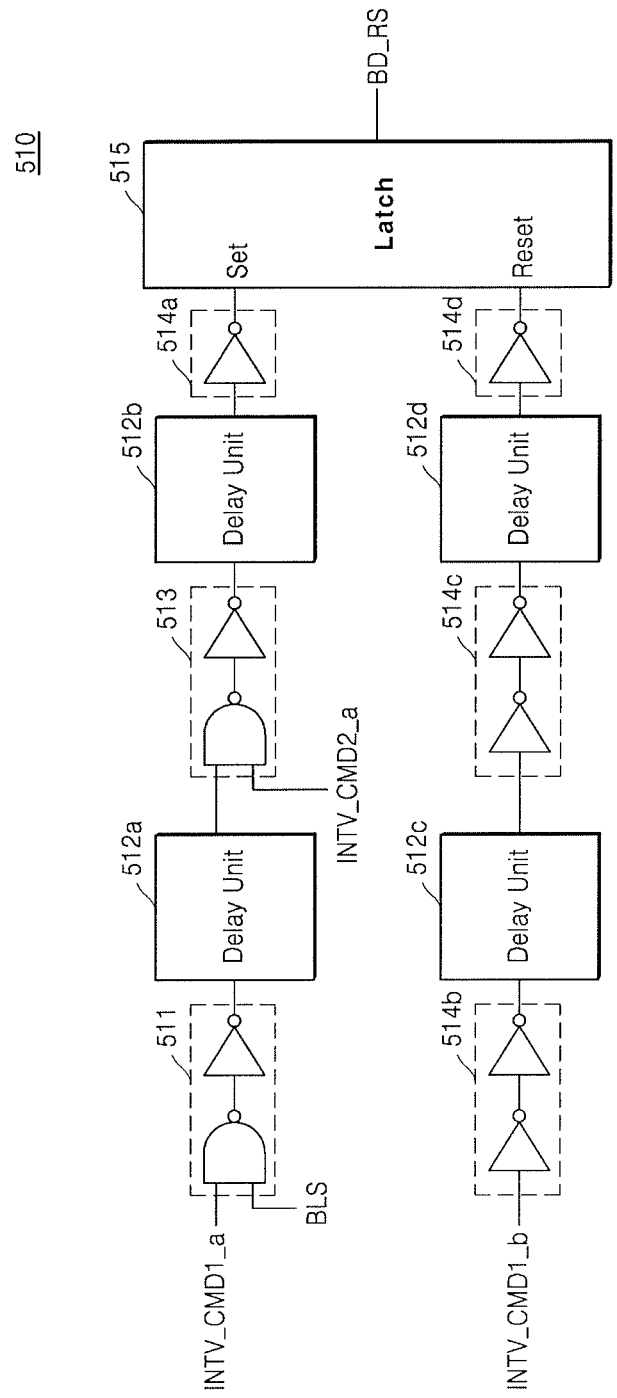
FIG. 8 illustrates an embodiment of a bubble interval detector.
Figure 9:
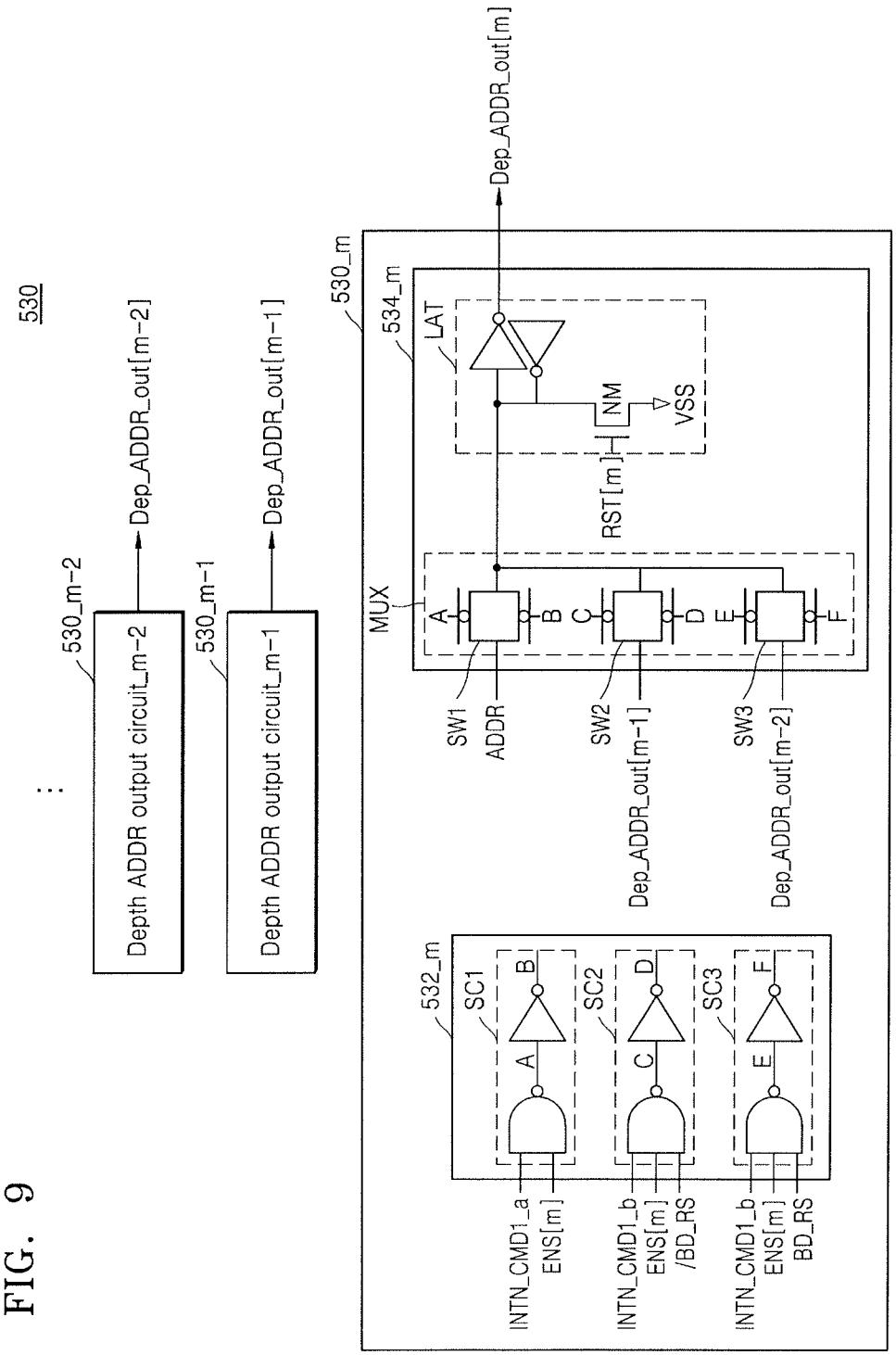
FIG. 9 illustrates an embodiment of a depth address output circuit.

The enable/reset signal generator 550 may provide an enable signal ENS to each of the first to n-th depth address output circuits 530_1 to 530_n such that the respective first to n-th depth address output circuits 530_1 to 530_n sequentially store and output addresses. In an embodiment, the enable/reset signal generator 550 may generate the enable signal ENS based on the internal commands INTN_CMDs. Also, when a memory device is powered off or receives a reset signal from the outside, the enable/reset signal generator 550 may provide a reset signal RST for resetting an address stored in each of the first to n-th depth address output circuits 530_1 to 530_n to each of the first to n-th depth address output circuits 530_1 to 530_n FIG. 8 illustrates an embodiment of the bubble interval detector 510 of FIG. 7, and FIG. 9 illustrates an embodiment of the depth address output circuit 530_m of FIG. 7. Here, each of a first internal command INTN_CMD1_a and a second internal command INTN_CMD2_a may be a signal generated based on a first command for controlling a memory operation of a target bank of a first bank group, a burst length signal BLS is a signal indicating whether the first command is a command for performing a data burst operation having a burst length of reference bits or more, and a third internal command INTN_CMD2_a is a signal generated in response to a second command for controlling a memory operation of a target bank of a second bank group.

Referring to FIG. 8, the bubble interval detector 510 may include a bubble interval detection start unit 511, delay units 512a to 512d, a signal detector 513, drivers 514a to 514d, and a latch 515. The drivers 514a to 514d may be circuits configured to improve characteristics of respective signals and align edges of the respective signals. Also, each of the delay units 512a to 512d may delay a signal by as much as a second clock cycle (e.g., 2 clocks).

Operation of setting a detection signal BD_RS will now be described. The bubble interval detection start unit 511 may receive the first internal command INTN_CMD1_a and the burst length signal BLS and start to detect a bubble interval. In an example, when the burst length signal BLS is a high-level signal indicating that the first command is a command for performing a data burst operation having a burst length of reference bits or more, the bubble interval detection start unit 511 may provide the first internal command INTN_CMD1_a to the delay unit 512a. The delay unit 512a may delay the first internal command INTN_CMD1_a by as much as the second clock cycle and provide the delayed first internal command INTN_CMD1_a to the signal detector 513.

When the bubble interval detection start unit 511 receives the third internal command INTN_CMD2_a after the second clock cycle from a time point at which the bubble interval detection start unit 511 receives the first internal command INTN_CMD1_a, the signal detector 513 may provide the delayed first internal command INTN_CMD1_a to the delay unit 512b, and the delay unit 512b may delay the delayed first internal command INTN_CMD2_a by as much as the second clock cycle and provide the delayed first internal command INTN_CMD2_a to the latch 515.

In this case, the latch 515 may output a high-level detection signal BD_RS indicating that a bubble interval is not detected. In another case, when the bubble interval detection start unit 511 does not receive the third internal command INTN_CMD2_a after the second clock cycle from the time point at which the first internal command INTN_CMD1_a is received, the signal detector 513 may not provide the delayed first internal command INTN_CMD1_a to the delay unit 512b, and the latch 515 may output a low-level detection signal BD_RS indicating that the bubble interval is detected.

The operation of resetting the detection signal BD_RS will now be described. After a first clock cycle from a time point at which the bubble interval detection start unit 511 receives the first internal command INTN_CMD1_a, the second internal command INTN_CMD1_b received by the bubble interval detector 510 may be delayed by as much as the first clock cycle by the delay units 512c and 512d, and the delay unit 512d may provide the delayed second internal command INTN_CMD1_b to the latch 515. In this case, the latch 515 may reset the detection signal BD_RS to an initial level (e.g., a low level). The bubble interval detector 510 may be differently configured in another embodiment.

Referring to FIG. 9, the depth-based address output unit 530 may include a plurality of depth address output circuits 530_1 to 530_n. An m-th depth address output circuit 530_m may include a storage path selector 532_m and an address storage unit 534_m. The m-th storage path selector 532_m may include first to third selection circuits SC1 to SC3. In an embodiment, the storage path selector 532_m may be enabled based on an m-th enable signal ENS[m] and receive a first internal command INTN_CMD1_a or a second internal command INTN_CMD2_b along with a detection signal RD_RS and a detection inverted signal /RD_RS. The m-th address storage unit 534m may include a multiplexer MUX including a plurality of switch elements, for example, switch elements SW1 to SW3, and a latch LAT. The multiplexer MUX may select a storage path based on a selection signal output by the storage path selector 532_m. The latch LAT may store an address through the selected storage path. Subsequently, the latch LAT may output the stored address to an m-th depth address output signal Dep_ADDR_out[m]. Configuration of the m-th depth address output circuit 530_m may be applied to other depth address output circuits 530_1 to 530_n.

In an embodiment, when the storage path selector 532_m receives the first internal command INTN_CMD1_a, the first selection circuit SC1 may generate a high-level first selection signal A, and the second selection circuit SC2 and the third selection circuit SC3 may generate a low-level second selection signal C and a low-level third selection signal E, respectively. The address storage unit 534_m may store an externally received address ADDR in the latch LAT based on the first selection signal A, and output the stored address ADDR as the depth address output signal Dep_ADDR_out[m].

When the storage path selector 532_m receives the second internal command INTN_CMD1_b and a low-level detection signal BD_RS, the second selection circuit SC2 may generate a high-level second selection signal C, and the first selection circuit SC1 and the third selection circuit SC3 may generate a low-level first selection signal A and a low-level third selection signal E, respectively.

The address storage unit 534_m may store an m−1-th depth address output signal Dep_ADDR_out[m−1] output by an m−1 depth address output circuit 530_m−1 in the latch LAT in response to the second selection signal C, and output the stored m−1-th depth address output signal Dep_ADDR_out[m−1] as the depth address output signal Dep_ADDR_out[m].

Finally, when the storage path selector 532_m receives the second internal command INTN_CMD1_b and a high-level detection signal BD_RS, the third selection circuit SC3 may generate a high-level third selection signal E, and the first selection circuit SC1 and the second selection circuit SC2 may generate a low-level first selection signal A and a low-level second selection signal C, respectively. The address storage unit 534_m may store an m−2-th depth address output signal Dep_ADDR_out[m−2] output by an m−2-th depth address output circuit 530_*m*−2 in the latch LAT in response to the third selection signal E and output the stored m−2-th depth address output signal Dep_ADDR_out [m−2] as the depth address output signal Dep_ADDR_out [m]. Subsequently, the latch LAT may receive an m-th reset signal RST[m] and be reset. The depth-based address output unit 530 may have a different configuration in another embodiment.

Figure 10A:
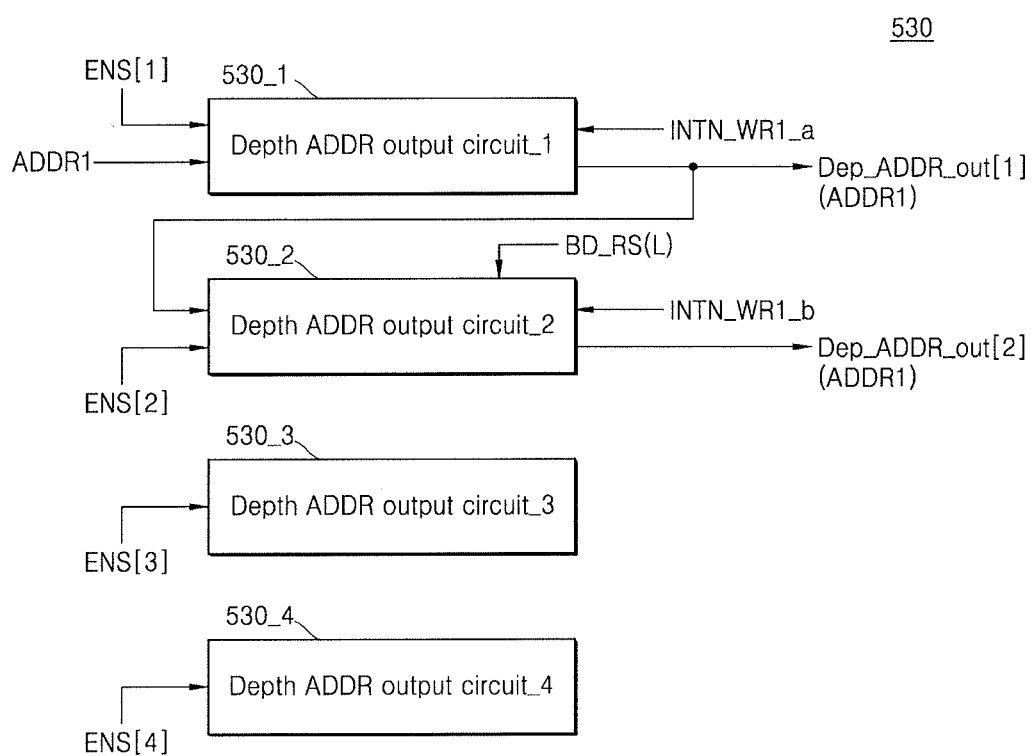
FIG. 10A illustrates an embodiment for controlling the storage and output of a first address of a depth-based address output unit when there is a bubble interval in a data burst interval corresponding to a first command.
Figure 10B:
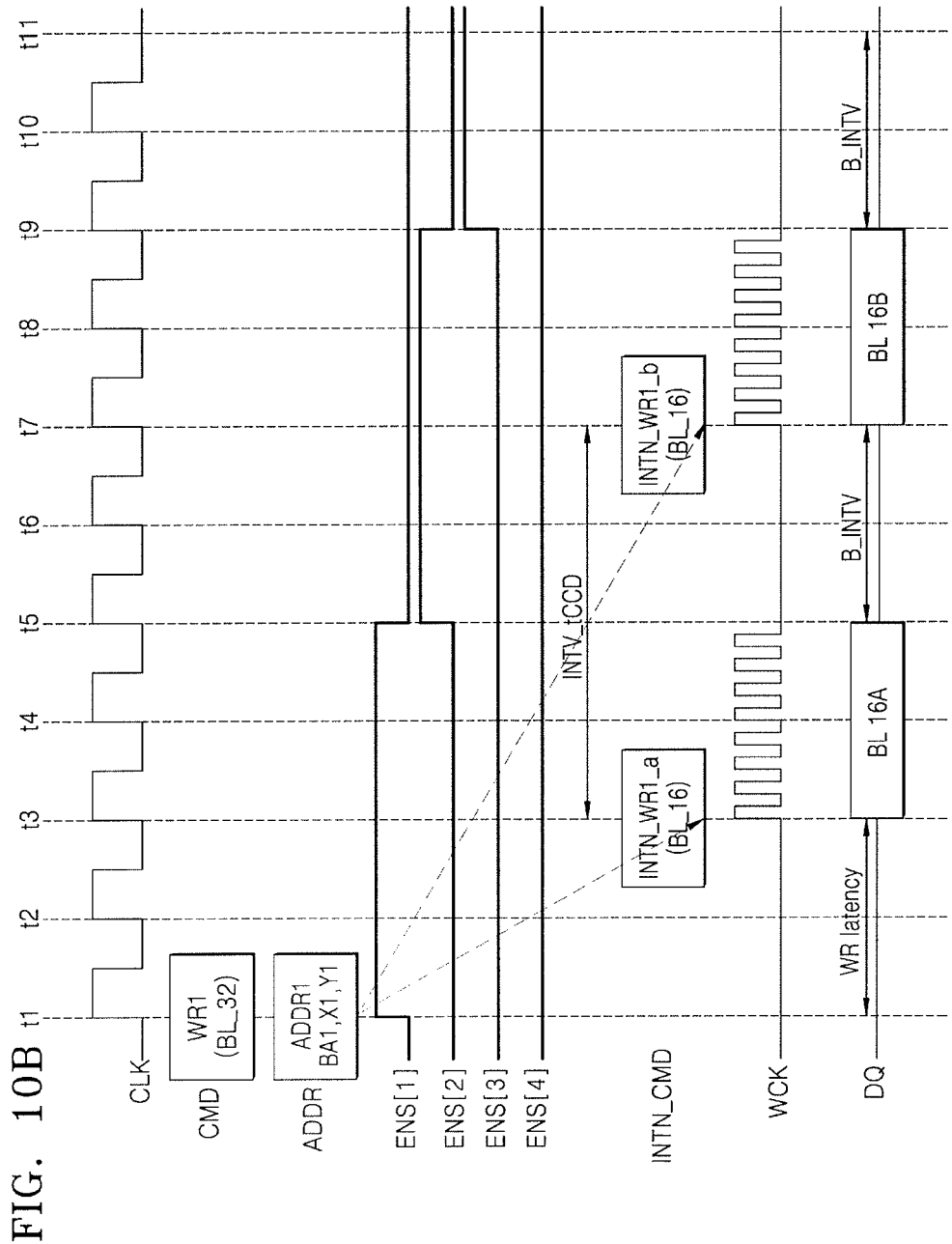
FIG. 10B illustrates an embodiment of a timing diagram for operating the depth-based address output unit of FIG. 10A.

FIG. 10A illustrates an embodiment for controlling the storage and output of a first address ADDR1 of a depth-based address output unit 530 when a bubble interval is in a data burst interval corresponding to a first command WR1 according to an embodiment. FIG. 10B illustrates an embodiment of a timing diagram for operating the depth-based address output unit 530 of FIG. 10A.

Referring to FIG. 10A, the depth-based address output unit 530 may include first to fourth depth address output circuit 530_1 to 530_4. Referring to FIG. 10B, since the first write command WR1, a first address ADDR1, and internal commands INTN_WR1_*a* and INTN_WR1_*b* are described above in detail with reference to FIG. 5A, operations of the depth-based address output unit 530 based on enable signals ENS[1] to ENS[4] will be described below.

Referring back to FIGS. 10A and 10B, the first depth address output circuit 530_1 may be enabled in time points t1 to t5 based on a first enable signal ENS[1], and receive a first internal write command INTN_WR1_*a* in a time point t3. The depth address output circuit 530_1 may receive the first address ADDR1 from the outside based on the first internal write command INTN_WR1_*a* and store the first address ADDR1. The first depth address output circuit 530_1 may output the first address ADDR1 as a first depth address output signal Dep_ADDR_out[1] to enable a memory operation in response to the first internal write command INTN_WR1_*a*.

After the time point t5, the first depth address output circuit 530_1 may be disabled. The second depth address output circuit 530_2 may be enabled between the time point t5 and the time point t9 based on a second enable signal ENS[2]. The second depth address output circuit 530_2 may receive a second internal write command INTN_WR1_*b* in the time point t7. The second depth address output circuit 530_2 may store the first address ADDR1 stored in the first depth address output circuit 530_1 based on the second internal write command INTN_WR1_*b* and a high-level (H) detection signal BD_RS. The second depth address output circuit 530_2 may output the first address ADDR1 to the second depth address output signal Dep_ADDR_out[2]) to enable a memory operation in response to the second internal write command INTN_WR1_*b*.

After the time point t9, the second depth address circuit 530_2 may be disabled. The third depth address output circuit 530_3 may be enabled based on the third enable signal ENS[3], receive the next internal command, and stand by to store and output an address corresponding to the next internal command.

Figure 11A:
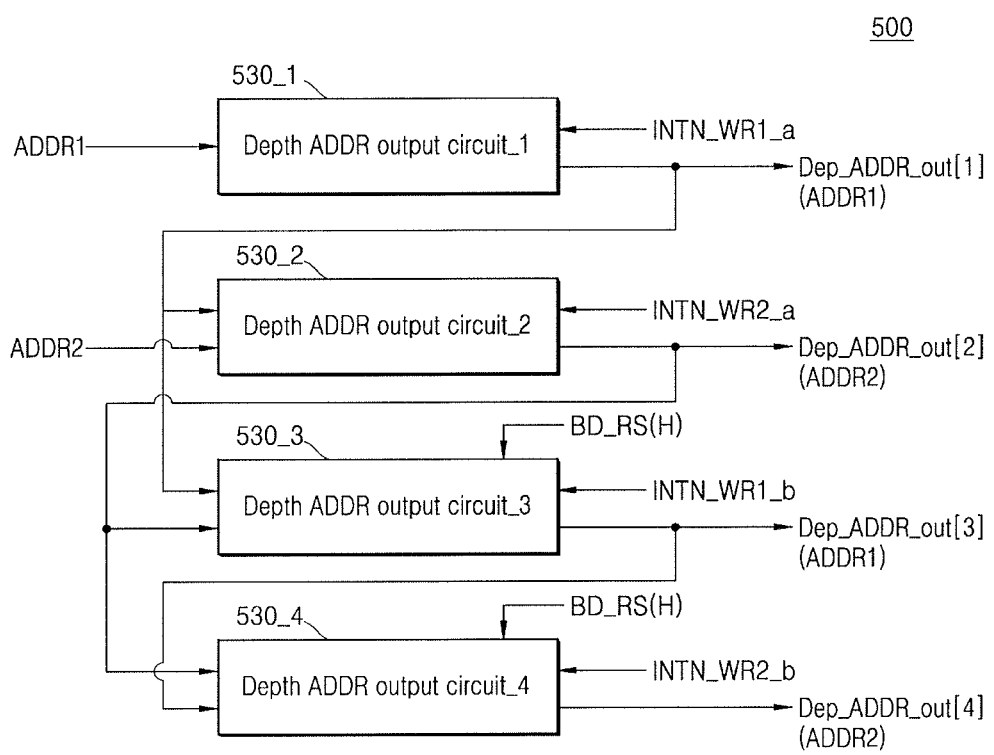
FIG. 11A illustrates an embodiment for controlling the storage and output of a first address of a depth-based address output unit when a bubble interval is not in a data burst interval corresponding to a first command.
Figure 11B:
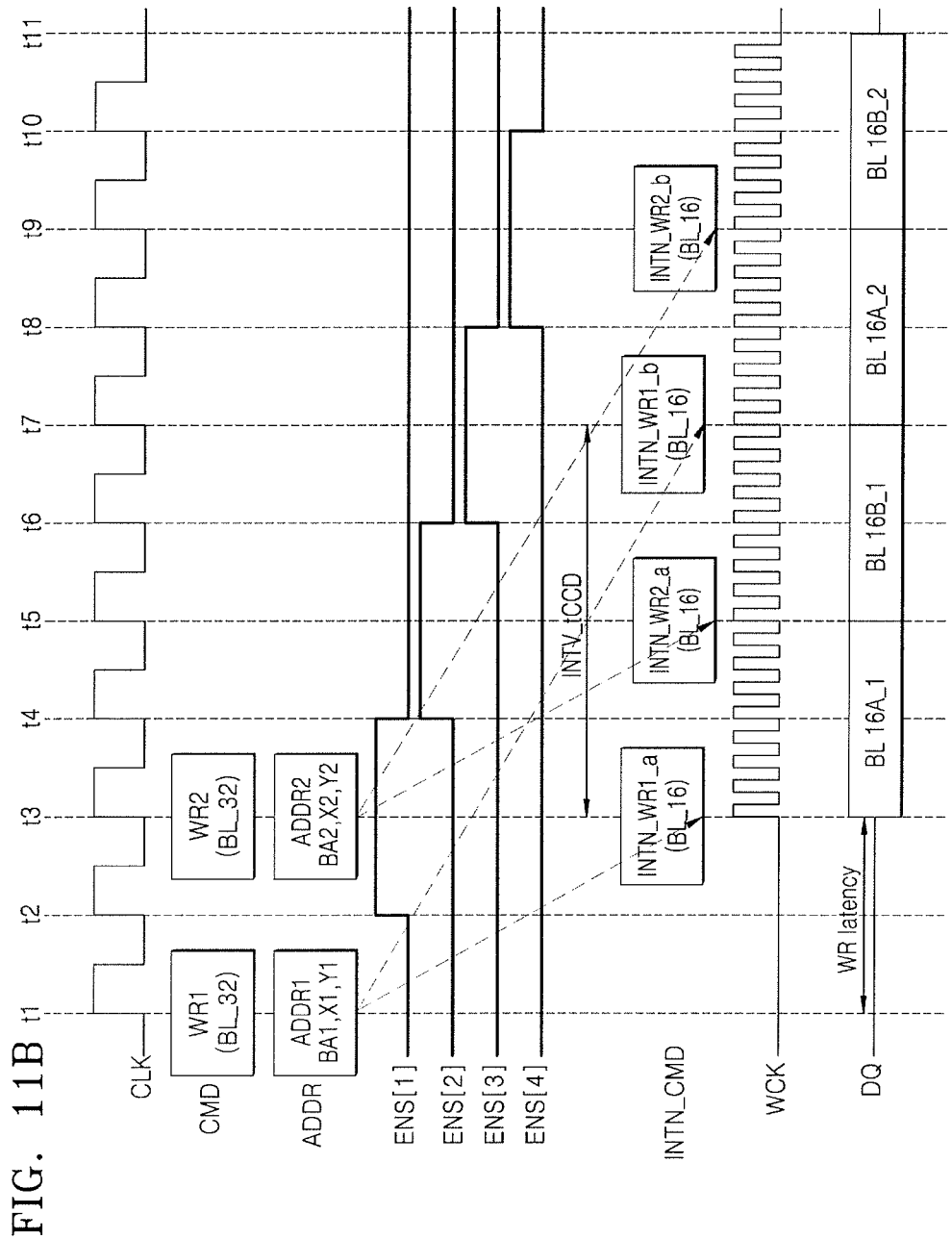
FIG. 11B illustrates an embodiment of a timing diagram for operating the depth-based address output unit of FIG. 11A.

FIG. 11A illustrates an embodiment for controlling the storage and output of a first address ADDR1 of a depth-based address output unit 530 when a bubble interval is not in a data burst interval corresponding to a first command WR1 according to an embodiment. FIG. 11B illustrates an embodiment of a timing diagram of an operation of the depth-based address output unit 530 of FIG. 11A.

Referring to FIG. 11A, the depth-based address output unit 530 may include first to fourth depth address output circuits 530_1 to 530_4. Referring to FIG. 10B, since the first write command WR1, the first address ADDR1, and internal commands INTN_WR1_*a* and INTN_WR1_*b* are described above in detail with reference to FIG. 5A, operations of the depth-based address output unit 530 in response to enable signals ENS[1] to ENS[4] will be described below.

Referring back to FIGS. 11A and 11B, the first depth address output circuit 530_1 may be enabled based on a first enable signal ENS[1] between a time point t2 and a time point t4, and receive a first internal write command INTN_WR1_*a* in the time point t3. The depth address output circuit 530_1 may receive the first address ADDR1 from the outside and store the first address ADDR1 based on the first internal write command INTN_WR1_*a*. The first depth address output circuit 530_1 may output the first address ADDR1 as a first depth address output signal Dep_ADDR_out[1] to enable a memory operation based on the first internal write command INTN_WR1_*a*.

After the time point t4, the first depth address output circuit 530_1 may be disabled. The second depth address output circuit 530_2 may be enabled between the time point t4 and the time point t6 based on a second enable signal ENS[2]. The second depth address output circuit 530_2 may receive a third internal write command INTN_WR2_*a* in the time point t5. The second depth address output circuit 530_2 may receive a second address ADDR2 from the outside and store the second address ADDR2 based on the third internal write command INTN_WR2_*a*. The second depth address output circuit 530_2 may output the second address ADDR2 as a second depth address output signal Dep_ADDR_out[2] to enable a memory operation based on the third internal write command INTN_WR2_*a*.

After the time point t6, the second depth address output circuit 530_2 may be disabled. The third depth address output circuit 530_3 may be enabled between the time point t6 and the time point t8 based on a third enable signal ENS[3]. The third depth address output circuit 530_3 may receive a second internal write command INTN_WR1_*b* in the time point t7. The third depth address output circuit 530_3 may store the first address ADDR1 stored in the first depth address output circuit 530_1 based on the second internal write command INTN_WR1_*b* and a low-level (L) detection signal BD_RS. The third depth address output circuit 530_3 may output the first address ADDR1 as a third depth address output signal Dep_ADDR_out[3] to enable a memory operation based on the second internal write command INTN_WR1_*b*.

After the time point t8, the third depth address output circuit 530_3 may be disabled. The fourth depth address output circuit 530_4 may be enabled between the time point t8 and the time point t10 based on a fourth enable signal ENS[4]. The fourth depth address output circuit 530_4 may receive a fourth internal write command INTN_WR2_*b* in the time point t9. The fourth depth address output circuit 530_4 may store the second address ADDR2 stored in the second depth address output circuit 530_2 based on the fourth internal write command INTN_WR2_*b* and the low-level (L) detection signal BD_RS. The fourth depth address output circuit 5304 may output the second address ADDR2 as a fourth depth address output signal Dep_ADDR_out[4] to enable a memory operation based on the fourth internal write command INTN_WR2_*b*.

Figure 12A:
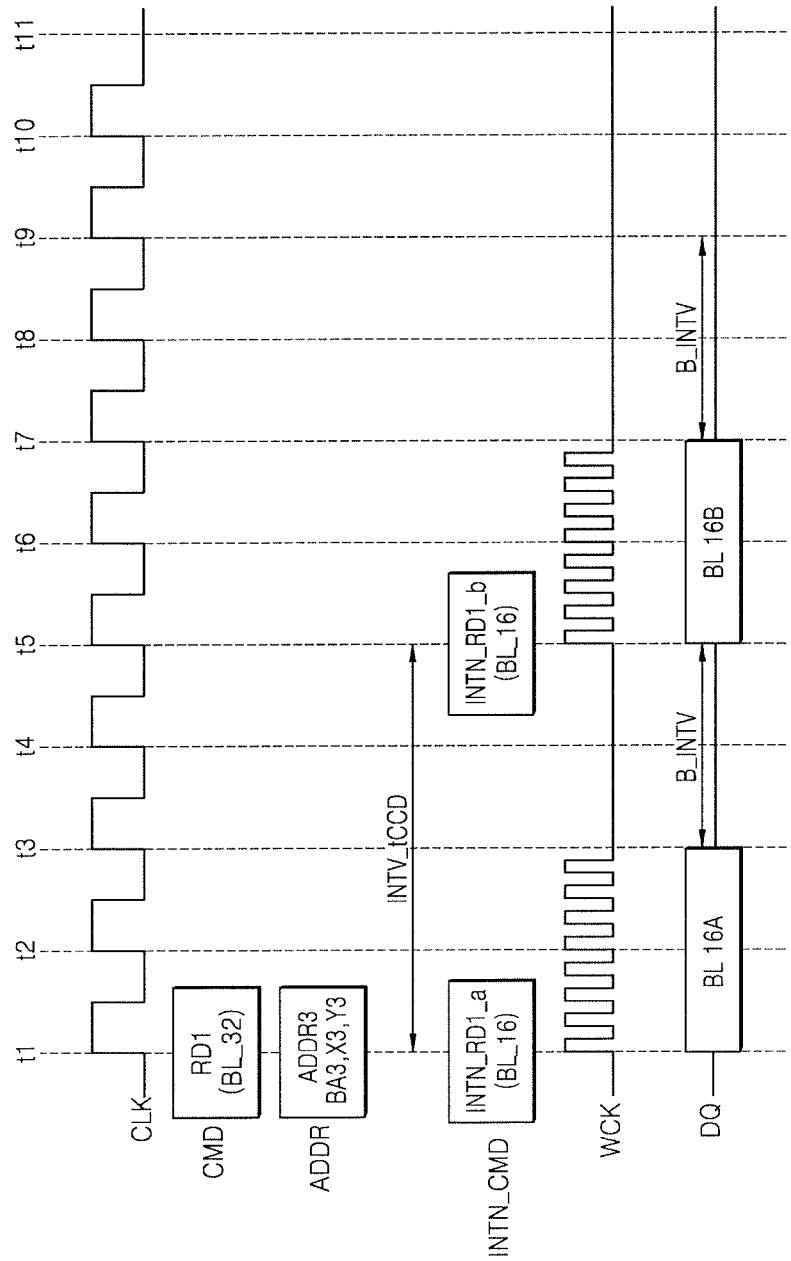
FIGS. 12A and 12B illustrate embodiments of timing diagrams for operating a memory device in a read operation.
Figure 12B:
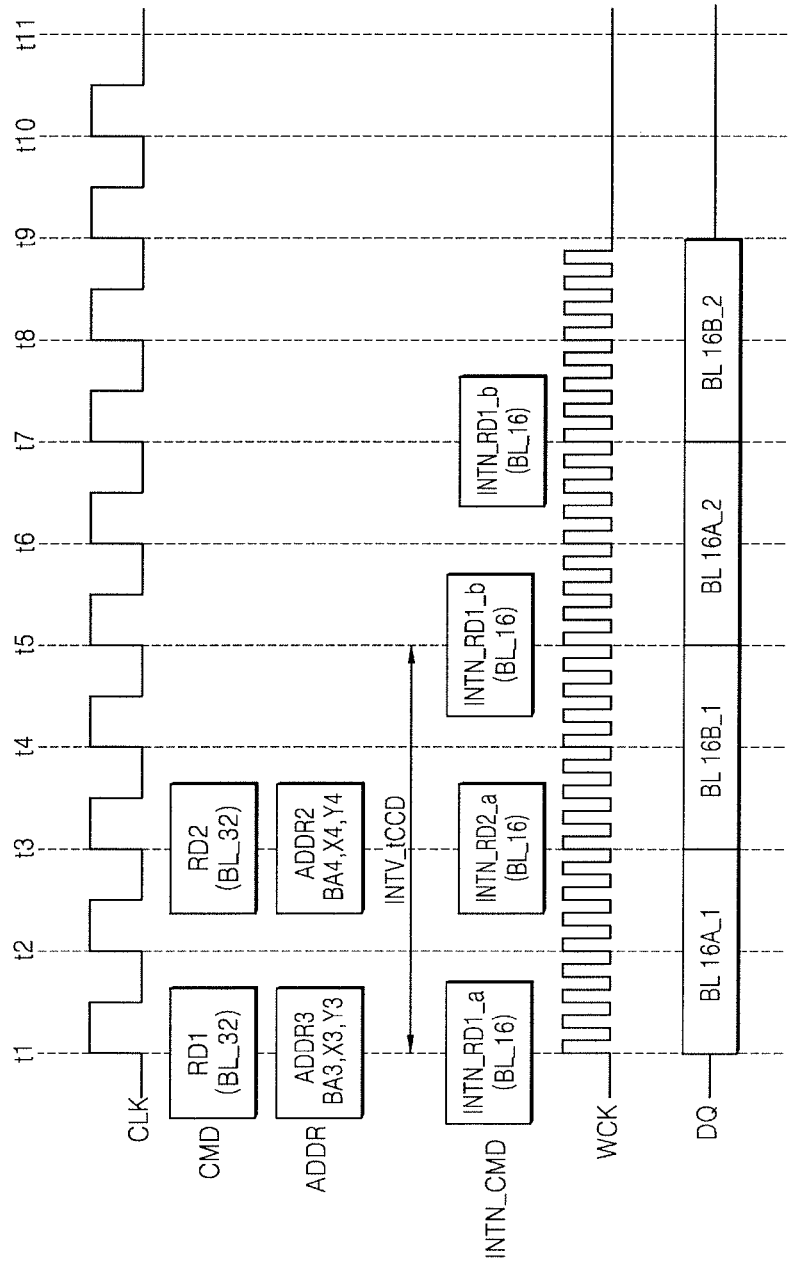

FIGS. 12A and 12B illustrates embodiments of timing diagrams for operating a memory device in a read operation. Referring to FIG. 12A, a write latency 'WR latency' may be present in a write operation based on a write command as shown in FIG. 5A. A read latency may not be present in a read operation based on a read command.

Thus, an internal command generator may receive a first read command RD1, output a first internal read command INTN_RD1_a to a first target bank in a time point t1, and output a second internal read command INTN_RD1_b to a first target bank in a time point t5, which is a tCCD interval INTV_tCCD after the time point t1. In this case, an address I/O circuit may output a first address ADDR3 in each of the time points t1 and t5 in accordance with the time points when the internal command generator outputs the first internal read command INTN_RD1_a and the second internal read command INTN_RD1_b to the first target bank. In an embodiment, a data clock WCK may be a signal based on a clock received from the outside (e.g., a memory controller).

In addition, referring to FIG. 12B, the internal command generator may further receive a second read command RD2, output a third internal read command INTN_RD2_a to a second target bank in the time point t3, and output a fourth internal read command INTN_RD2_b to the second target bank in the time point t5, which is a tCCD interval INTV_tCCD after the time point t3. In this case, the address I/O circuit may output a second address ADDR4 to the second target bank in each of the time points t3 and t7 in accordance with the time points when the internal command generator outputs the third internal read command INTN_RD2_a and the fourth internal read command INTN_RD2_b to the second target bank.

Figure 13:
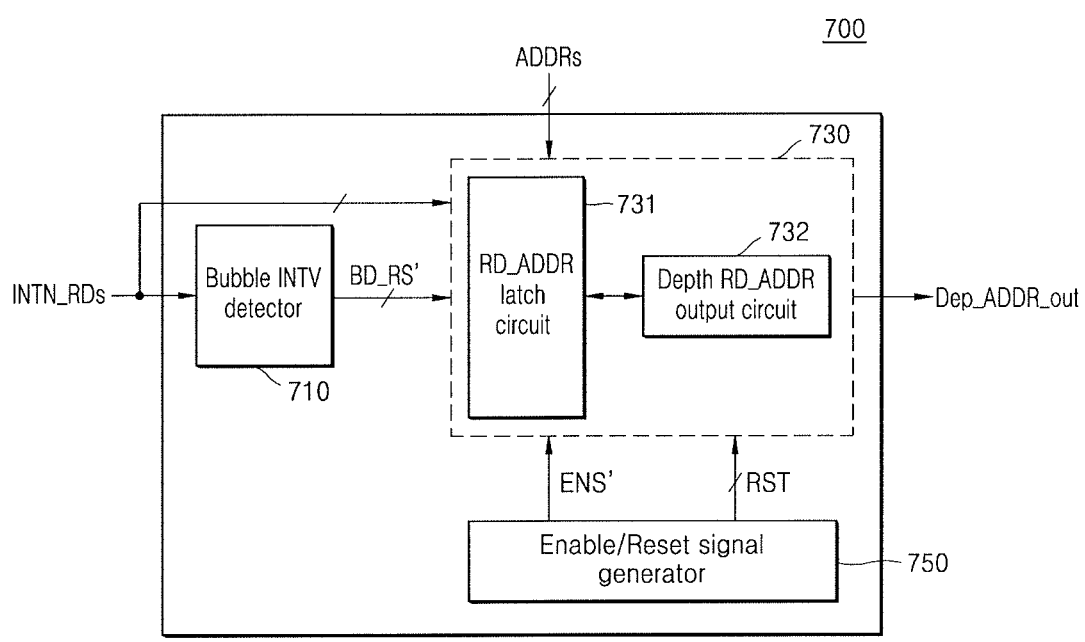
FIG. 13 illustrates an embodiment of an address I/O circuit that operates in consideration of a read operation devoid of a read latency.

FIG. 13 illustrates an embodiment of an address I/O circuit 700 configured to operate in consideration of a read operation devoid of a read latency.

Referring to FIG. 13, the address I/O circuit 700 may include a bubble interval detector 710, a depth-based address output unit 730, and an enable/reset signal generator 750. The bubble interval detector 710 may receive internal read commands INTN_RDs and detect a bubble interval based on patterns of the internal read commands INTN_RDs. The bubble interval detector 710 may generate a detection signal BD_RS' based on a detection result of the bubble interval and provide the detection signal BD_RS' to the depth-based address output unit 730. The depth-based address output unit 730 may include a read address latch circuit 731 and a depth read address output circuit 732.

The read address latch circuit 731 may store addresses ADDRs received based on the internal commands INTN_CMDs. Specifically, the read address latch circuit 731 may change positions in which the addresses ADDRs are stored, based on the internal read commands INTN_RDs. The depth read address output circuit 732 may select an address required for a read operation, from among the addresses ADDRs stored in the read address latch circuit 731, based on the detection signal BD_RS', and output the selected address as a depth read address output signal Dep_RD_ADDR_out.

When the read operation is performed, the enable/reset signal generator 750 may generate an enable signal ENS' for enabling the depth-based address output unit 730. In an embodiment, the enable/reset signal generator 750 may generate the enable signal ENS' based on the internal read commands INTN_RDs. Also, when a memory device is powered off or receives a reset signal from the outside, the enable/reset signal generator 750 may provide a reset signal RST to the depth-based address output unit 730 and reset the addresses ADDRs stored in the read address latch circuit 731.

Figure 14:
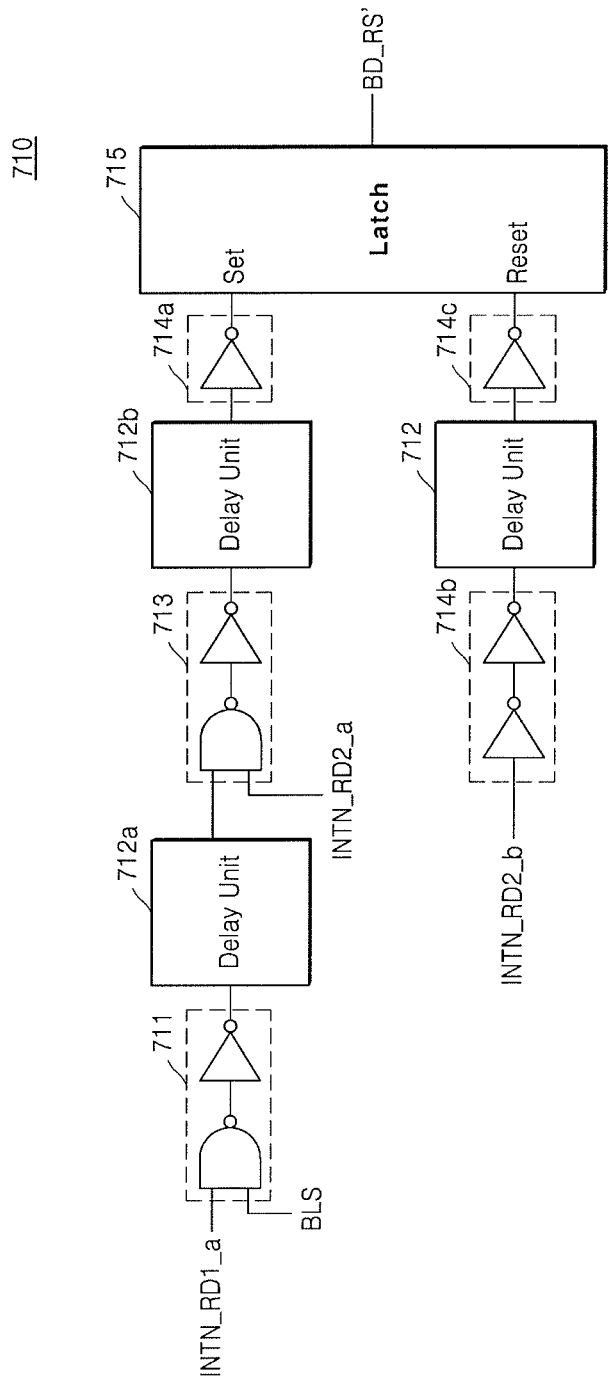
FIG. 14 illustrates another embodiment of a bubble interval detector.

FIG. 14 illustrates an embodiment of the bubble interval detector 710 of FIG. 13 and an embodiment of the depth-based address output unit 730 of FIG. 13.

Referring to FIG. 14, the bubble interval detector 710 may include a bubble interval detection start unit 711, delay units 712a to 712c, a signal detector 713, drivers 714a to 714c, and a latch 715. Since the number of the delay units 712a to 712c connected to a reset terminal of the latch 715 in the bubble interval detector 710 is one less than in the bubble interval detector 510 of FIG. 8, a time point at which a detection signal BD_RS' of the latch 715 is set may be by as much as a second clock cycle earlier than a time point at which the detection signal BD_RS of the latch 515 of FIG. 8 is reset. For example, the time point at which the detection signal BD_RS' of the bubble interval detector 710 is set may be controlled to be different from the time point at which the detection signal BD_RS of the bubble interval detector 510 of FIG. 8 is reset. Operations of the bubble interval detector 710 may be similar to operations of the bubble interval detector 510 of FIG. 8. The configuration of the bubble interval detector 710 may be different in another embodiment.

Figure 15:
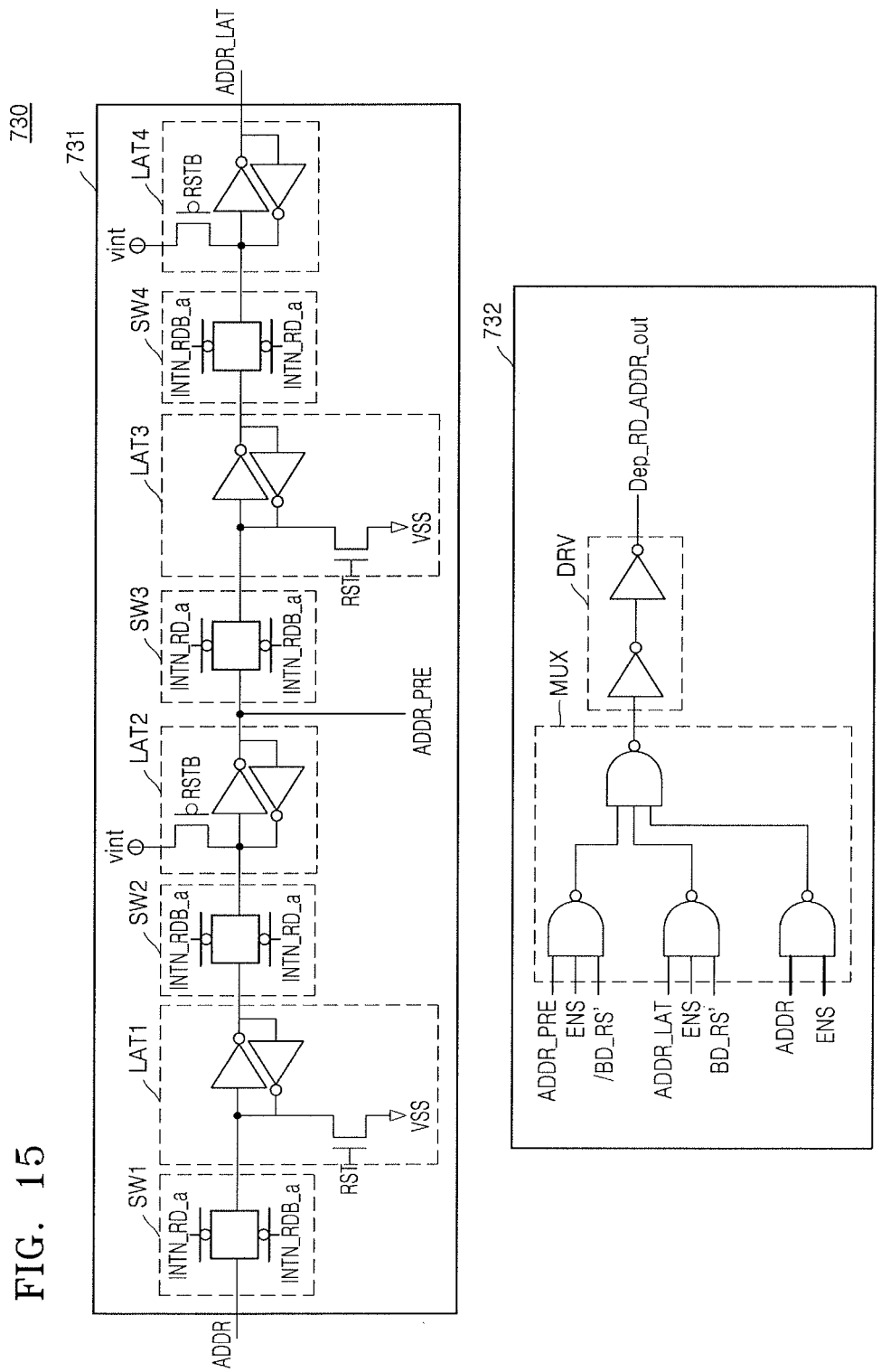
FIG. 15 illustrates an embodiment of a depth-based address output unit.

Referring further to FIG. 15, the depth-based address output unit 730 may include a read address latch circuit 731 and a depth read address output circuit 732. The read address latch circuit 731 may include a plurality of switch elements SW1 to SW4 and a plurality of latches LAT1 to LAT4. The read address latch circuit 731 may change a latch in which an address ADDR is stored, based on an internal read command INTN_RD_a. The internal read command INTN_RD_a may be a firstly generated or output internal read command, from among internal read commands corresponding to a predetermined read command. For example, from among a first internal read command a second internal read command, which correspond to a first read command, and a third internal read command and a fourth internal read command, which correspond to a second read command, the read address latch circuit 731 may change the latch in which the address ADDR is stored, based on the first internal command and the third internal command.

The depth read address output circuit 732 may include a multiplexer MUX and a driver DRV. As described above with reference to FIG. 1, the depth read address output circuit 732 may output the address ADDR to banks. A specific output method of the depth read address output circuit 732 according to an embodiment will now be described.

The depth read address output circuit 732 may be connected to output terminals of a second latch LAT2 and a fourth latch LAT4 of the read address latch circuit 731 and receive an address ADDR_PRE stored in the second latch LAT2 and an address ADDR_LAT stored in the fourth latch LAT4. The depth read address output circuit 732 may directly output the received address ADDR as the depth read address output signal Dep_RD_ADDR_out based on an enable signal ENS, or select any one of an address ADDR_PRE stored in the second latch LAT2 and an address ADDR_LAT stored in the fourth latch LAT4 based on the enable signal ENS and the detection signal BD_RS' and output the selected address as the depth read address output signal Dep_RD_ADDR_out. The configuration of the depth-based address output unit 730 may be different in another embodiment.

Figure 16:
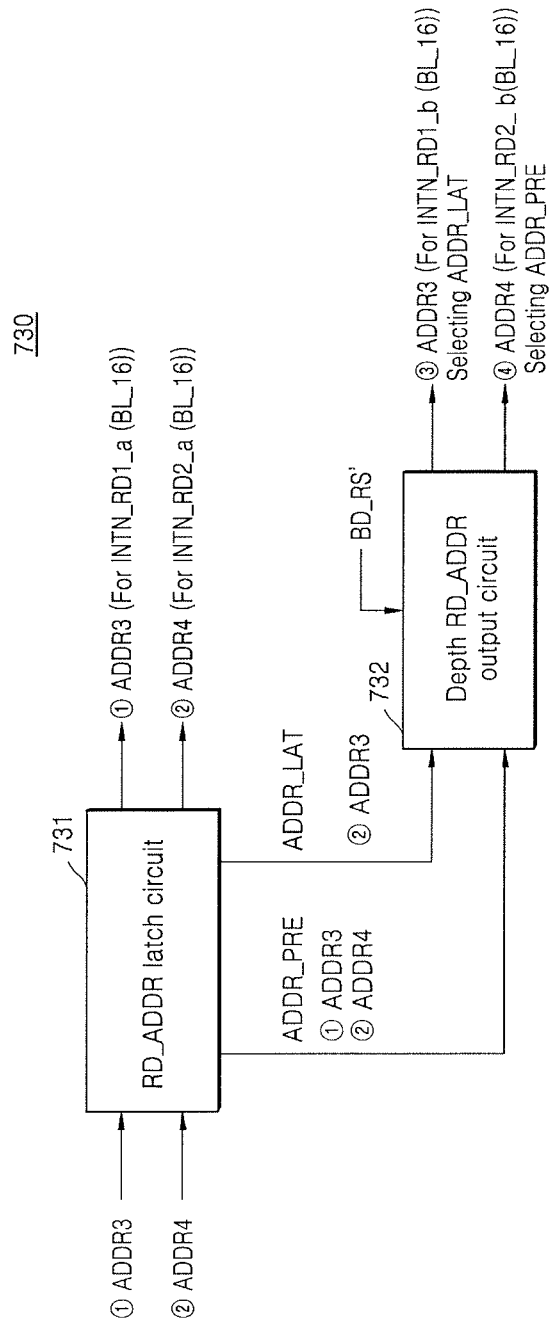
FIG. 16 illustrates another embodiment of a depth-based address output unit.

FIG. 16 illustrates an embodiment of an operation of the depth-based address output unit 730 corresponding to the timing diagram of FIG. 12B. Referring to FIGS. 12B and 13 to 16, to begin, when the read address latch circuit 731 receives a first address ADDR3 and a first internal read command INTN_RD1_a, the read address latch circuit 731 may sequentially store the first address ADDR3 in a first latch LAT1 and the second latch LAT2. Also, since the bubble interval detector 710 receives only the first internal read command INTN_RD1_a, the bubble interval detector 710 may output an initial-level (e.g., low-level) detection signal BD_RS'. The depth read address output circuit 732 may directly select the first address ADDR3 and output the first address ADDR3 as a depth read address output signal Dep_RD_ADDR_out.

When the read address latch circuit 731 receives a second address ADDR4 and a third internal read command INTN_RD2_a, the read address latch circuit 731 may sequentially store a second address ADDR4 in the first latch LAT1 and the second latch LAT2, and sequentially the first address ADDR3 in the third latch LAT3 and the fourth latch LAT4. Also, since the bubble interval detector 710 receives the third internal read command INTN_RD2_a after a second clock cycle from a time point at which the bubble interval detector 710 receives the first internal read command INTN_RD1_a, the bubble interval detector 710 may output a high-level detection signal BD_RS'. The depth read address output circuit 732 may directly select the second address ADDR4 and output the second address ADDR4 as the depth read address output signal Dep_RD_ADDR_out.

When the read address latch circuit 731 receives the second internal read command INTN_RD1_b, the read address latch circuit 731 may maintain a storage state of each of the first to fourth latches LAT1 to LAT4. Although the bubble interval detector 710 receives the second internal read command INTN_RD1_b, the bubble interval detector 710 may output a detection signal BD_RS', which is maintained at a high level, due to a delay unit 712. The depth read address output circuit 732 may select and output the address ADDR_LAT stored in the fourth latch LAT4 based on the high-level detection signal BD_RS'. That is, the depth read address output circuit 732 may output the first address ADDR3 stored in the fourth latch LAT4 as the depth read address output signal Dep_RD_ADDR_out to perform a read operation in response to the second internal read command INTN_RD1_b.

When the read address latch circuit 731 receives the fourth internal read command INTN_RD2_b, the read address latch circuit 731 may maintain a storage state of each of the first to fourth latches LAT1 to LAT4. Since the second clock cycle has elapsed after the bubble interval detector 710 receives the second internal read command INTN_RD1_b, the read address latch circuit 731 may output a detection signal BD_RS', which is reset to a low level. The depth read address output circuit 732 may select and output the address ADDR_PRE stored in the second latch LAT2 based on the low-level detection signal BD_RS'. That is, the depth read address output circuit 732 may output the second address ADDR4 as a depth read address output signal Dep_RD_ADDR_out to enable a read operation based on the fourth internal read command INTN_RD2_b.

Figure 17:
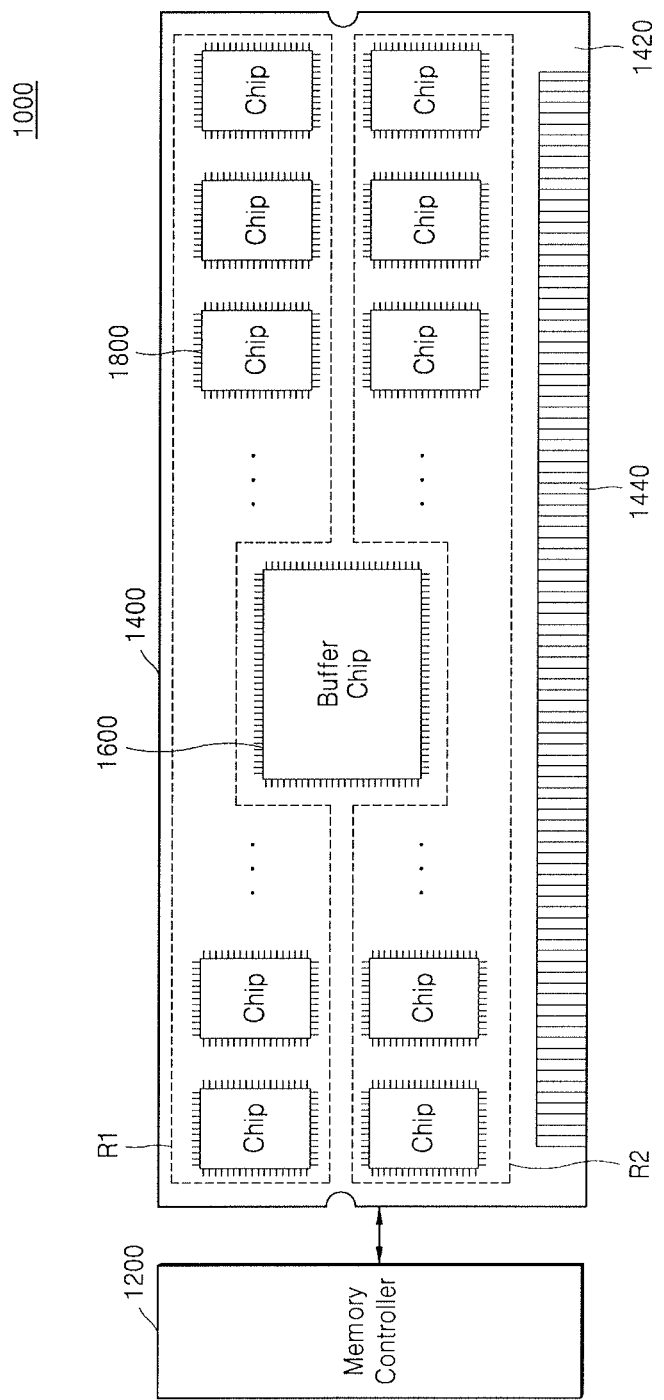
FIG. 17 illustrates another embodiment of a memory system.

FIG. 17 illustrates an embodiment of a memory system 1000 which may include a memory controller 1200 and a memory module 1400. The memory module 1400 may include at least one memory chip 1800, each of which may include a memory cell array, and a buffer chip 1620 for transceiving signals between the at least one memory chip 1800 and the memory controller 1200 or manage a memory operation on the memory chips 1800. The memory chips 1800 of the memory module 1400 may be divided into a first rank R1 and a second rank R2. Each of the at least one memory chip 1800 may include an address I/O circuit AIDC to which the embodiments described with reference to FIGS. 1 to 16 are applied to perform a memory operation.

Although FIG. 17 illustrates an example in which part of function of the memory controller 1200 is performed in a load-reduced dual in-line memory module (LRDIMM)-type memory module, the inventive concept is not limited thereto. For example, a fully buffered DIMM (FBDIMM)-type memory module may be applied to the memory module 1400, and an advanced memory buffer (AMB) chip may be mounted as a buffer chip on the memory module 1400. In addition, another type of memory module may be applied to the memory module 1400, and the at least part of the function of the memory controller 1200 may be performed in the memory module 1400.

Figure 18:
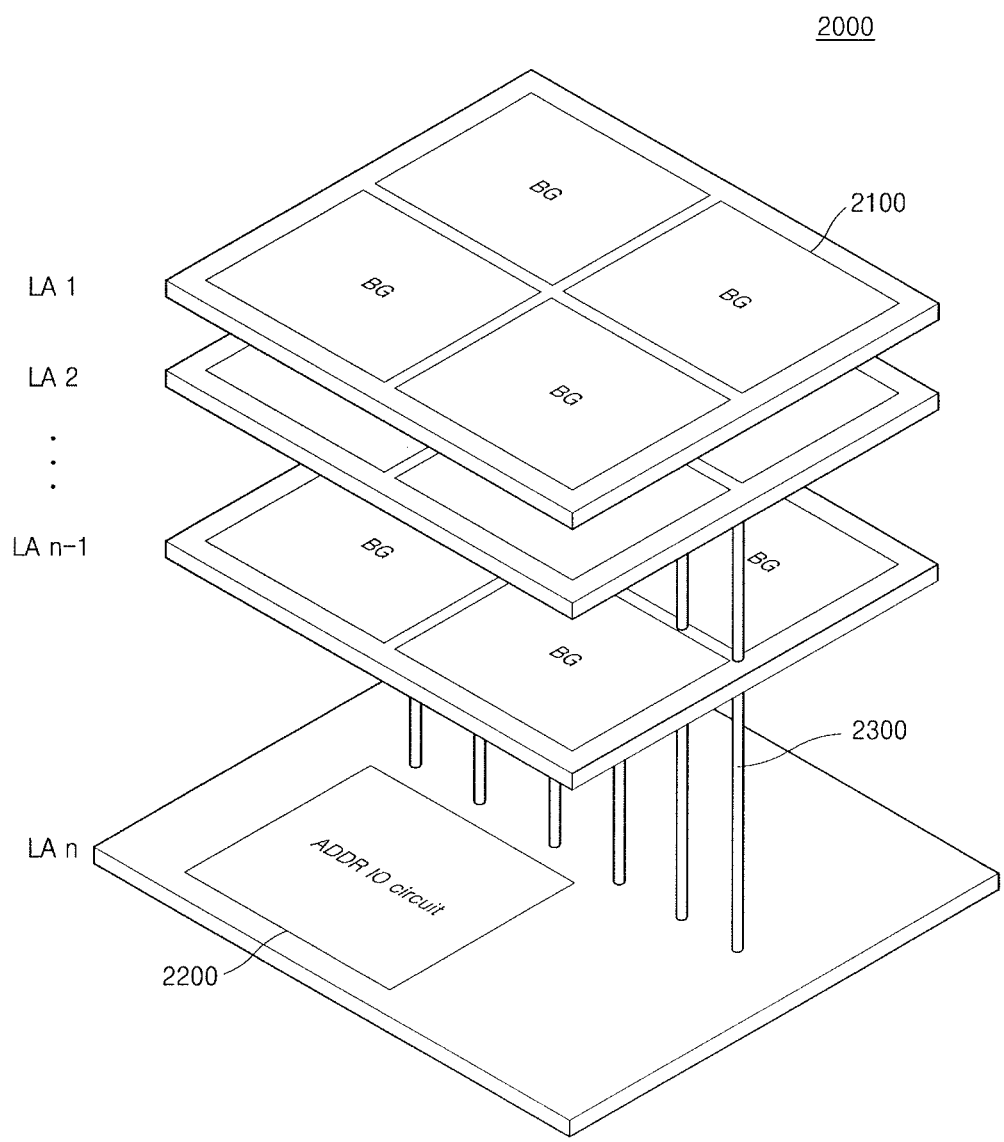
FIG. 18 illustrates an embodiment of a semiconductor package.

FIG. 18 illustrates an embodiment of a semiconductor package 2000 including a stack structure having a plurality of layers. Referring to FIG. 18, the semiconductor package 2000 may include a plurality of layers LA1 to LAn. Each of first to n-1-th layers LA1 to LAn may be a memory layer (or a memory chip) including a plurality of memory bank groups 2100.

Each of the memory bank groups 2100 may include a plurality of banks, each of which may include a memory cell array configured to store data, a row decoder, a column decoder, and a sense amplifier. The n-th layer LAn) may be a buffer layer. In the semiconductor package 2000, the stacked layers LA1 to LAn may be connected to one another through through-silicon vias (TSVs) 2300. The buffer layer LAn may communicate with an external memory controller and the memory layers LA1 to LAn−1, and route transceiving signals between the memory layers LA1 to LAn−1 and the external memory controller. The buffer layer LAn may include an address I/O circuit 2200. The embodiments described with reference to FIGS. 1 to 16 may be applied to the address I/O circuit 2200 to perform a memory operation.

Figure 19:
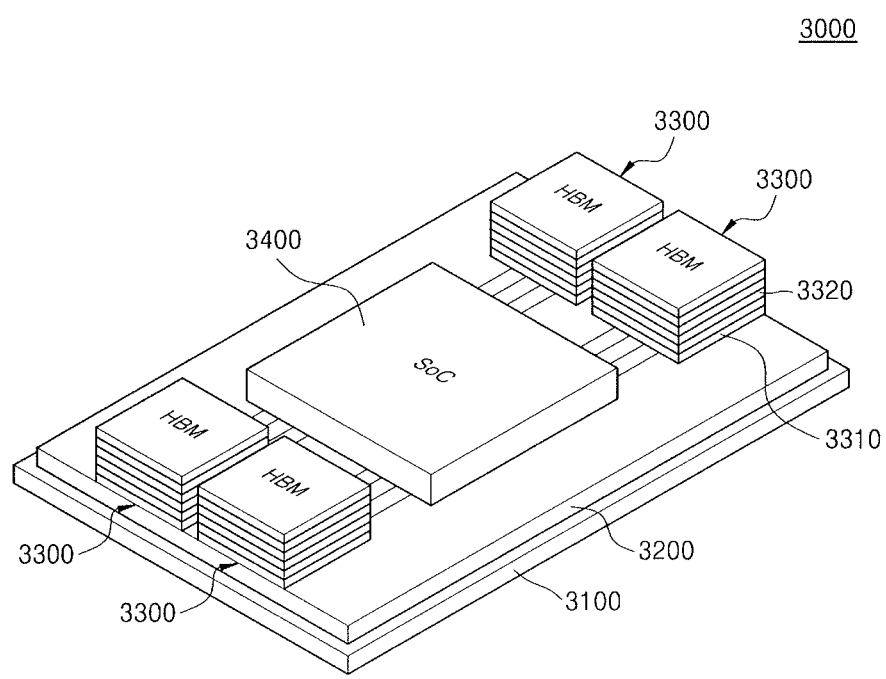
FIG. 19 illustrates another embodiment of a semiconductor package.

FIG. 19 illustrates an embodiment of a semiconductor package 3000 including a stack semiconductor chip. Referring to FIG. 19, the semiconductor package 3000 may be a memory module including at least one stack semiconductor chip 3300 and a System-on-Chip (SoC) 3400, which are mounted on a package substrate 3100 (e.g., a printed circuit board (PCB)). An interposer 3200 may be optionally further provided on the package substrate 3100.

The stack semiconductor chip 3300 may be embodied by a Chip-on-Chip (CoC). The stack semiconductor chip 3300 may include at least one memory chip 3320 stacked on a buffer chip 3310 (e.g., a logic chip). The buffer chip 3310 and the at least one memory chip 3320 may be connected to each other by through-silicon vias (TSVs). The buffer chip 3320 may include an address I/O circuit to which the embodiments described with reference to FIGS. 1 to 16 are applied to perform a memory operation. In an example, the stack semiconductor chip 3300 may be a high-bandwidth memory (HBM) having a bandwidth of about 500 GB/sec to about 1 TB/sec or higher.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The generators, controllers, outputs, interfaces, modules, detectors, decoders, delays and other units, latches, and other signal generating, signal providing, and signal processing features of the embodiments disclosed herein may be implemented in non-transitory logic which, for example, may include hardware, software, or both. When implemented at least partially in hardware, the generators, controllers, outputs, interfaces, modules, detectors, decoders, delays and other units, latches, and other signal generating, signal providing, and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the generators, controllers, outputs, interfaces, modules, detectors, decoders, delays and other units, latches, and other signal generating, signal providing, and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

The various operations of methods described above may be performed by any suitable means capable of performing the operations, such as various hardware and/or software component(s), circuits, and/or module(s).

The software may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

In accordance with one or more of the aforementioned embodiments, due to a frequency difference between the reference clock and the data clock, an interval (e.g., a bubble interval) in which data is not transceived to and from a pad may occur during a memory operation (e.g., a data burst operation corresponding to a command) of the memory device. To improve efficiency of the memory system and performance of the memory system, the memory system may perform a memory operation for reducing or minimizing a bubble interval. For example, an address I/O circuit may control a circuit (that stores an address when there is a bubble interval in the data burst operation interval corresponding to a received command) to be different from a circuit that stores the address when there is not the bubble interval. The address I/O circuit may output the stored address to the bank group BG in accordance with a time point at which the internal command is output to the bank group BG. Due to the above-described operations of the address I/O circuit, the bubble interval may be reduced. As a result, the memory device may perform efficient memory operations.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A memory device, comprising:
   a first bank group;
   a second bank group, each of the first and second bank groups including a plurality of banks;
   an internal command generator to generate a first internal command and a second internal command based on a first command from a memory controller, the first command to control a memory operation of a first target bank in the first bank group, the internal command generator to output the first internal command and the second internal command to the first target bank; and
   an address input/output (I/O) circuit to receive a first address corresponding to the first command, select a storage path of the first address based on whether there is a bubble interval in a data burst operation interval corresponding to the first command, control output of the first address in accordance with a time point at which each of the first internal command and the second internal command is output, and store the first address in the address I/O circuit, wherein
   the address I/O circuit includes a bubble interval detector to detect the bubble interval based on whether a second command to control a memory operation of a second target bank in the second bank group is received from the memory controller within a first clock cycle from a time point at which the memory device receives the first command, the bubble interval detector to generate a detection signal.

2. The memory device as claimed in claim 1, wherein a frequency of data clocks synchronized in a data burst operation is greater than a frequency of reference clocks synchronized in the memory operation.

3. The memory device as claimed in claim 1, wherein:
   when a burst length of a data burst operation corresponding to the first command is 2n bits, which is equal to or higher than reference bits, each of a burst length of a data burst operation corresponding to the first internal command and a burst length of a data burst operation corresponding to the second internal command is n bits, where n is an integer equal to or more than 2.

4. The memory device as claimed in claim 1, wherein a burst length of a data burst operation corresponding to the first command is equal to or different from a burst length of a data burst operation corresponding to a second command received by the memory device after the memory device receives the first command.

5. The memory device as claimed in claim 1, wherein:
the data burst operation interval corresponding to the first command includes a first data burst operation interval corresponding to the first internal command and a second data burst operation interval corresponding to the second internal command,
the bubble interval is an interval for which a data burst operation is not performed between the first data burst operation interval and the second data burst operation interval.

6. The memory device as claimed in claim 1, wherein:
the first clock cycle includes a time interval based on a core cycle to perform a memory operation based on the first internal command, and
the internal command generator is to output the second internal command to the first target bank after the first clock cycle, from a time point at which the internal command generator outputs the first internal command to the first target bank.

7. The memory device as claimed in claim 1, wherein:
the internal command generator is to generate a third internal command based on the second command at a time point at which the second command is received, and
when the third internal command is received after a second clock cycle from a time point at which the first internal command is received, the bubble interval detector is to set the detection signal to a first level indicating that the bubble interval is detected, after the second clock cycle from a time point at which the third internal command is received.

8. The memory device as claimed in claim 7, wherein the second clock cycle is a time interval of the bubble interval.

9. The memory device as claimed in claim 8, wherein:
when the second internal command is received, the bubble interval detector is to reset the detection signal to a second level after the first clock cycle from the time point at which the second internal command is received.

10. The memory device as claimed in claim 1, wherein:
the address I/O circuit includes a depth-based address output including first to third depth address output circuits to store respective addresses therein, and
the first to third depth addresses output circuits are to sequentially output the respective addresses stored therein to any one of the banks.

11. The memory device as claimed in claim 10, wherein, when the first internal command is received, the depth-based address output is to:
store the first address received from the memory controller in the first depth address output circuit, and
store the first address stored in the first depth address output circuit, in one of the second depth address output circuit and the third depth address output circuit, based on the detection signal.

12. The memory device as claimed in claim 11, wherein, when the detection signal is at a first level indicating that the bubble interval is detected, the depth-based address output is to:
store the first address stored in the first depth address output circuit in the third depth address output circuit, and store a second address corresponding to the second command in the second depth address output circuit.

13. The memory device as claimed in claim 11, wherein:
when the detection signal is at a second level indicating that the bubble interval is not detected, the depth-based address output is to store the first address stored in the first depth address output circuit in the second depth address output circuit.

14. The memory device as claimed in claim 1, wherein the memory device is to operate in an on-the-fly mode to perform a data burst operation having a variable burst length.

15. A memory device, comprising:
a first bank group;
a second bank group, each of the first and second bank groups including a plurality of banks;
an internal command generator to generate a first internal command and a second internal command based on a first command received from a memory controller, the first command to control a memory operation of a first target bank of the first bank group, generate a third internal command based on a second command received from the memory controller to control a memory operation of a second target bank of the second bank group after the first command, and output the first to third internal commands; and
an address input/output (I/O) circuit to receive the first to third internal commands, receive from the memory controller a first address corresponding to the first command and a second address corresponding to the second command, and store the first address and the second address using a storage path selected based on whether the third internal command is received, within a first clock cycle from a time point at which the first internal command is received, wherein:
the address I/O circuit includes first to third depth address output circuits to store respective addresses therein, and
the first to third depth address output circuits are to sequentially output the respective addresses stored therein to one of the banks.

16. The memory device as claimed in claim 15, wherein:
when the third internal command is received within the first clock cycle from the time point at which the first internal command is received, the address I/O circuit is to store the first address received from the memory controller in the first depth address output circuit and output the first address to the first target bank through the first depth address output circuit in accordance with a time point at which the internal command generator outputs the first internal command to the first target bank,
the address I/O circuit is to store, in the second depth address output circuit, the second address received from the memory controller and output the second address to the second target bank through the second depth address output circuit in accordance with a time point at which the internal command generator outputs the third internal command to the second target bank, and
the address I/O circuit is to store the first address stored in the first depth address output circuit in the third depth address output circuit and output the first address to the first target bank through the third depth address output circuit in accordance with a time point at which the internal command generator outputs the second internal command to the first target bank of the first bank group.

17. The memory device as claimed in claim 15, wherein:

when the third internal command is not received within the first clock cycle from the time point at which the first internal command is received, the address I/O circuit is to store the first address received from the memory controller in the first depth address output circuit and output the first address to the first target bank through the first depth address output circuit in accordance with a time point at which the internal command generator outputs the first internal command to the first target bank, the address I/O circuit is to store the first address stored in the first depth address output circuit in the second depth address output circuit and output the first address to the first target bank through the second depth address output circuit in accordance with a time point at which the internal command generator outputs the second internal command to the first target bank, and the address I/O circuit is to store the second address received from the memory controller in the third depth address output circuit and output the second address to the second target bank through the third depth address output circuit in accordance with a time point at which the internal command generator outputs the third internal command to the second target bank.

18. A non-transitory computer-readable medium comprising code, which, when executed by a processor, causes the processor to:

generate, by an internal command generator, a first internal command and a second internal command based on a first command from a memory controller, the first command to control a memory operation of a first target bank in a first bank group;

receive, by an address input/output (I/O) circuit, a first address corresponding to the first command;

detect a bubble interval based on whether a second command to control a memory operation of a second target bank in a second bank group is received from the memory controller within a first clock cycle from a time point at which the internal command generator receives the first command;

generate a detection signal by a bubble internal detector of the address I/O circuit when the bubble interval is detected;

select a storage path of the first address based on the detection signal;

control output of the first address in accordance with a time point at which each of the first internal command and the second internal commands is output to the first target bank; and store the first address in the address I/O circuit.

* * * * *